United States Patent
Kar et al.

(10) Patent No.: US 11,145,732 B2
(45) Date of Patent: Oct. 12, 2021

(54) FIELD-EFFECT TRANSISTORS WITH DUAL THICKNESS GATE DIELECTRICS

(71) Applicant: Intel Corporation, Santa Clara, CA (US)

(72) Inventors: Ayan Kar, Portland, OR (US); Kalyan C. Kolluru, Portland, OR (US); Nicholas A. Thomson, Hillsboro, OR (US); Mark Armstrong, Portland, OR (US); Sameer Jayanta Joglekar, Hillsboro, OR (US); Rui Ma, Portland, OR (US); Sayan Saha, Portland, OR (US); Hyuk Ju Ryu, Portland, OR (US); Akm A. Ahsan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 16/699,566

(22) Filed: Nov. 30, 2019

(65) Prior Publication Data

US 2021/0167180 A1    Jun. 3, 2021

(51) Int. Cl.
*H01L 29/78*    (2006.01)
*H01L 29/423*    (2006.01)
(Continued)

(52) U.S. Cl.
CPC .... *H01L 29/42368* (2013.01); *H01L 27/0255* (2013.01); *H01L 27/0274* (2013.01);
(Continued)

(58) Field of Classification Search
CPC ........... H01L 29/42368; H01L 27/0255; H01L 27/0274; H01L 29/0878; H01L 29/0886
See application file for complete search history.

(56) References Cited

U.S. PATENT DOCUMENTS 9,087,719 B2    7/2015    Ahsan et al.
9,502,883 B2    11/2016    Ahsan et al.
(Continued)

FOREIGN PATENT DOCUMENTS

WO      2014051760 A1    4/2014

OTHER PUBLICATIONS

Infineon Technologies Austria AG, "Preventing ESD Induced Failures in Small Signal Mosfets," Application Note AN Apr. 2013 v2.0, Apr. 2013; 6 pages.
(Continued)

*Primary Examiner* — Thomas L Dickey
(74) *Attorney, Agent, or Firm* — Patent Capital Group

(57) ABSTRACT

Disclosed herein are transistor arrangements of field-effect transistors with dual thickness gate dielectrics. An example transistor arrangement includes a semiconductor channel material, a source region and a drain region, provided in the semiconductor material, and a gate stack provided over a portion of the semiconductor material that is between the source region and the drain region. The gate stack has a thinner gate dielectric in a portion that is closer to the source region and a thicker gate dielectric in a portion that is closer to the drain region, which may effectively realize tunable ballast resistance integrated with the transistor arrangement and may help increase the breakdown voltage and/or decrease the gate leakage of the transistor.

20 Claims, 14 Drawing Sheets

(51) Int. Cl.
H01L 27/02 (2006.01)
H01L 29/40 (2006.01)
H01L 29/08 (2006.01)

(52) U.S. Cl.
CPC ........ *H01L 29/086* (2013.01); *H01L 29/0878* (2013.01); *H01L 29/0886* (2013.01); *H01L 29/401* (2013.01); *H01L 29/785* (2013.01)

(56) References Cited

U.S. PATENT DOCUMENTS

| | | |
|---|---|---|
| 10,103,542 B2 | 10/2018 | Ahsan et al. |
| 2015/0326007 A1 | 11/2015 | Ahsan et al. |
| 2017/0040793 A1 | 2/2017 | Ahsan et al. |
| 2017/0103923 A1* | 4/2017 | Nidhi ................. H01L 29/7851 |

OTHER PUBLICATIONS

Miyata, T., et al., "150 GHz FMAX With High Drain Breakdown Voltage Immunity by Multi Gate Oxide Dual Work-Function (MGO-DWF)-Mosfet," IEEE International Electron Devices Meeting (IEDM) 2015, Washington, D.C., Dec. 5-9, 2015; 4 pages.

Robinson-Hahn, Donna, et al., "ESD Protection Design for Discrete Semiconductors," Electronic Products, posted on Feb. 19, 2009, 3 pages; https://www.electronicproducts.com.

* cited by examiner

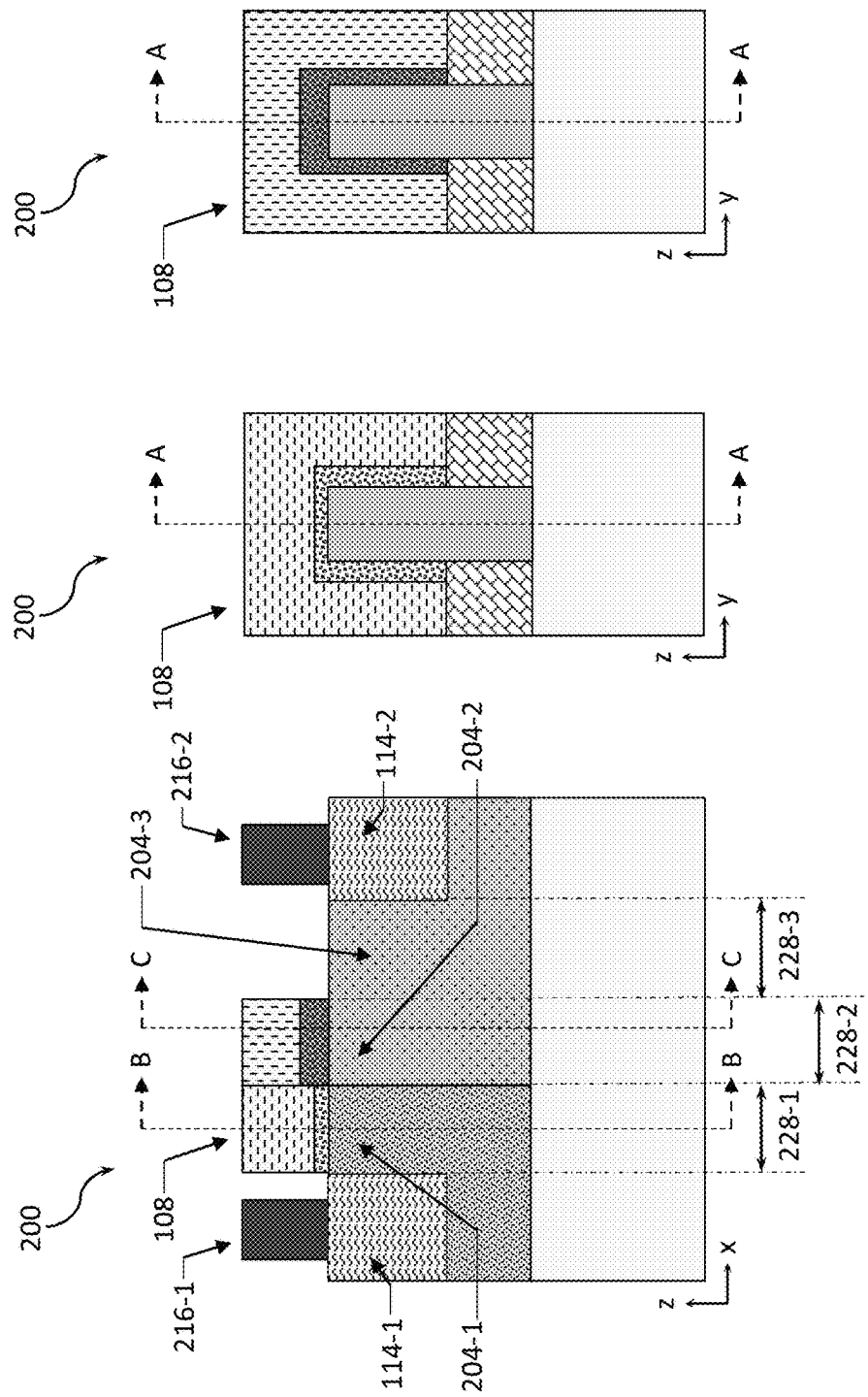
FIG. 2A
FIG. 2B
FIG. 2C
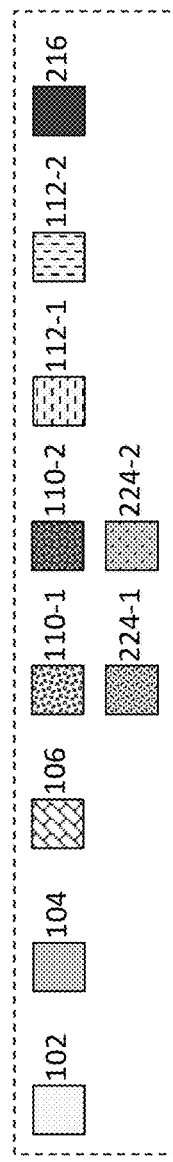

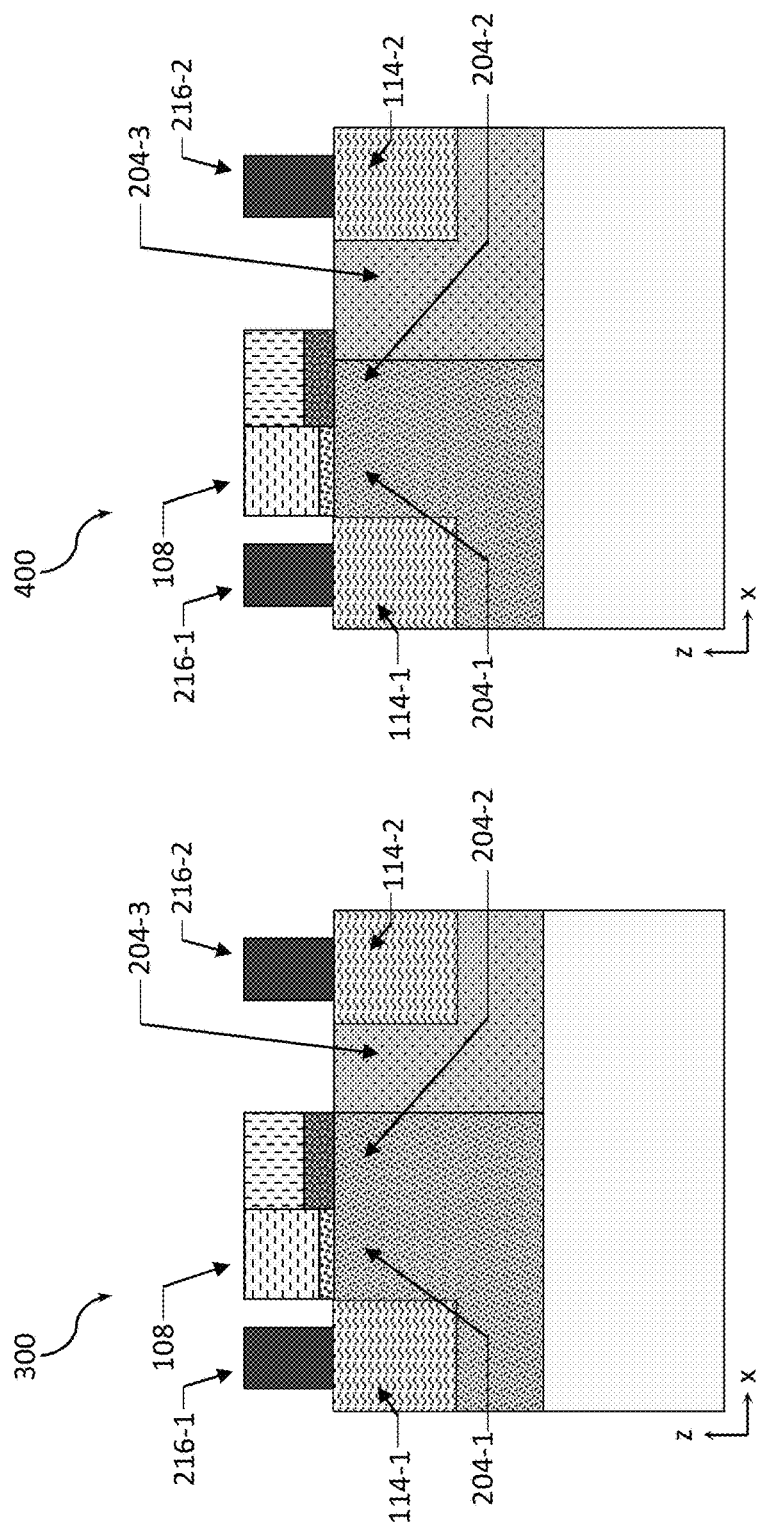
FIG. 3
FIG. 4
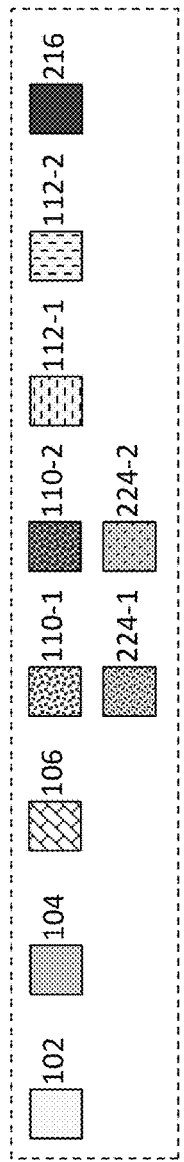

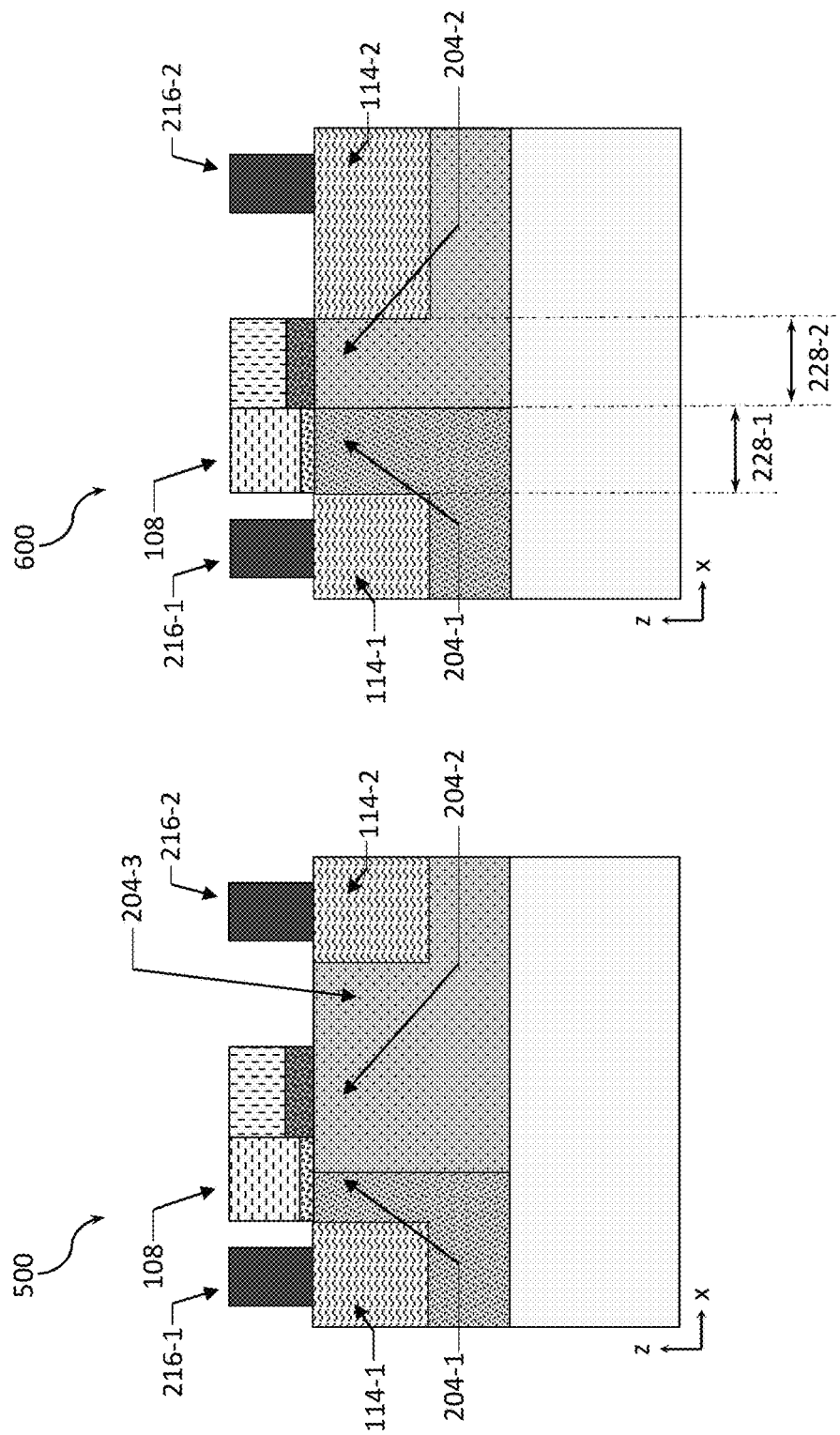
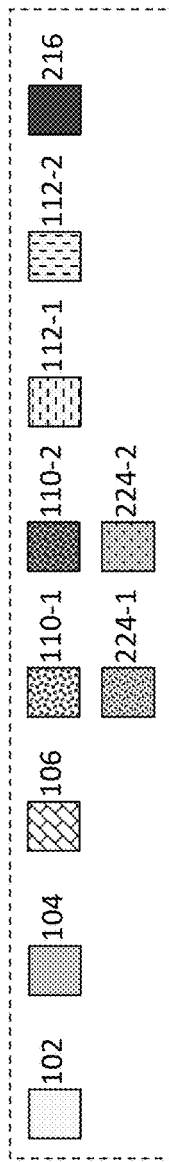
FIG. 5
FIG. 6

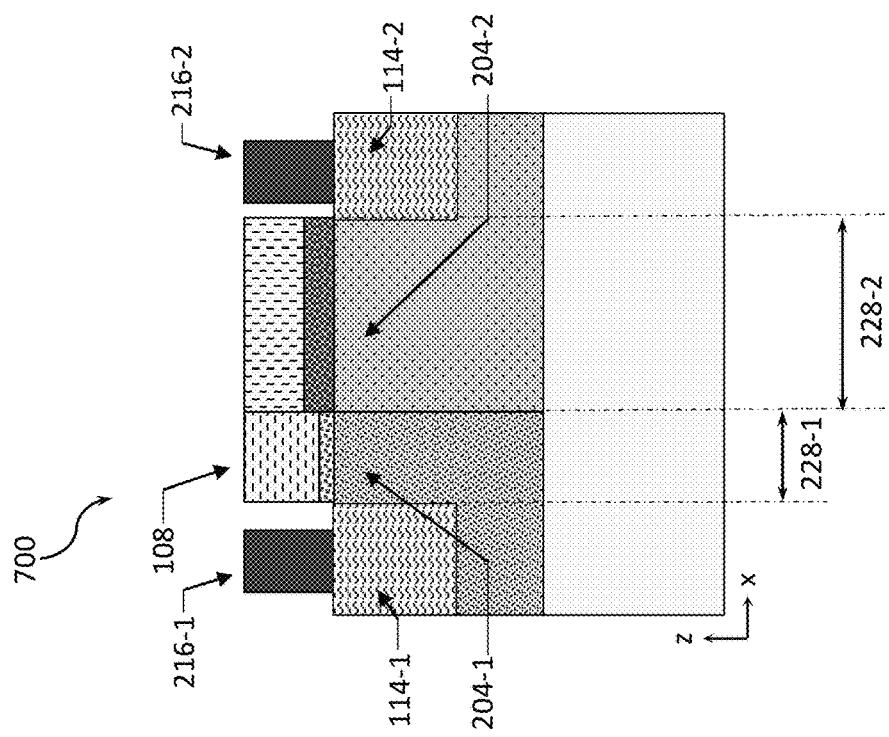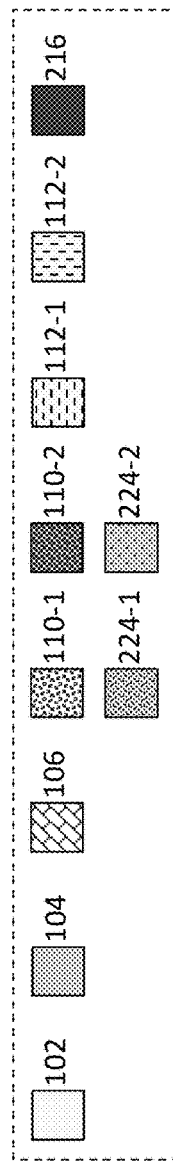
FIG. 7

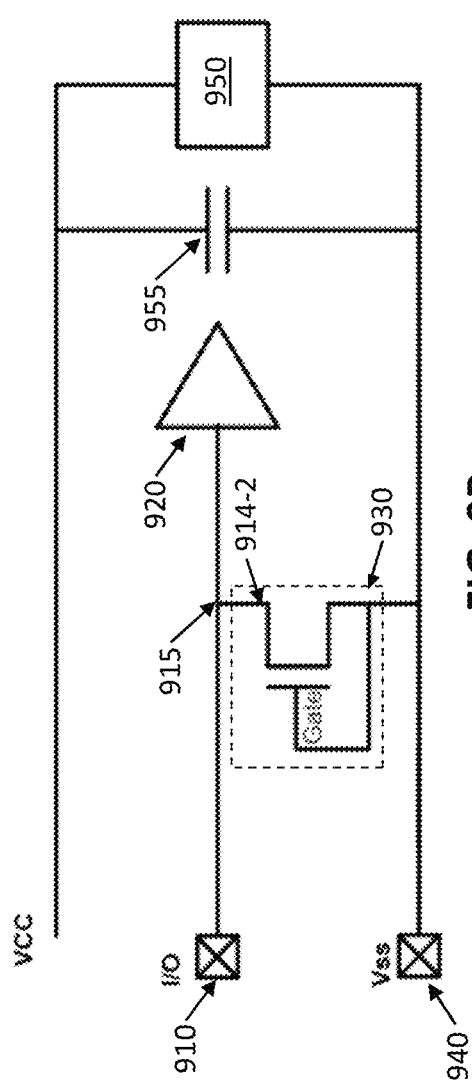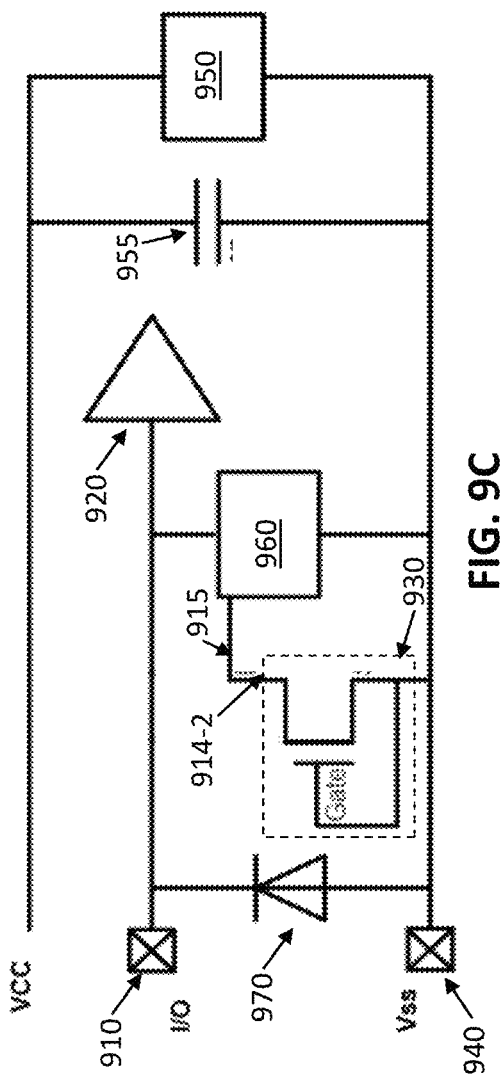

FIELD-EFFECT TRANSISTORS WITH DUAL THICKNESS GATE DIELECTRICS

TECHNICAL FIELD

This disclosure relates generally to the field of semiconductor devices, and more specifically, to field-effect transistors (FETs).

BACKGROUND

A FET, e.g., a metal oxide semiconductor (MOS) FET (MOSFET), is a three-terminal device that includes source, drain, and gate terminals and uses electric field to control current flowing through the device. A FET typically includes a semiconductor channel material, a source and a drain regions provided in the channel material, and a gate stack that includes a gate dielectric material and a gate electrode material, provided over a portion of the channel material between the source and the drain regions.

FETs may be used as an electrostatic discharge (EDS) protection device in high-speed input/output (I/O) designs. For example, a FET implemented as a ground-gate N-type MOSFET (GGNMOS) may be used as a snapback mode ESD protection device. In such implementations, during the ESD events, high current/voltage at the drain of the GGNMOS causes it to snapback and, ideally, the transistor begins to shunt the ESD current to ground, protecting the core circuit from the ESD stress.

The ideal operation described above may not always be realized because conventional GGNMOS devices are very susceptible to gate dielectric breakdown and may fail prematurely during ESD events. For example, the ideal operation may be compromised due to high voltage ESD spike at the drain of the GGNMOS, which can induce gate dielectric leakage and/or breakdown at the corner region between the drain and the gate dielectric.

Adding series ballast resistance at the drain node of a GGNMOS device may help to distribute the ESD current across all legs of the device more uniformly to achieve higher ESD protection (i.e., to withstand higher ESD currents). However, adding an external ballast resistor has the drawback of significantly increasing the layout complexity, footprint, and capacitive coupling.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2C are cross-sectional side views of an integrated circuit (IC) structure with an example FinFET that includes a dual thickness gate dielectric according to some embodiments of the disclosure.

FIGS. 3-7 are cross-sectional side views of an IC structure with an example FinFET that includes a dual thickness gate dielectric according to other embodiments of the disclosure.

FIGS. 9A-9C are schematic circuit diagrams of electronic devices implementing FETs with dual thickness gate dielectrics, according to some embodiments of the disclosure.

DETAILED DESCRIPTION

Overview

Figure 1:
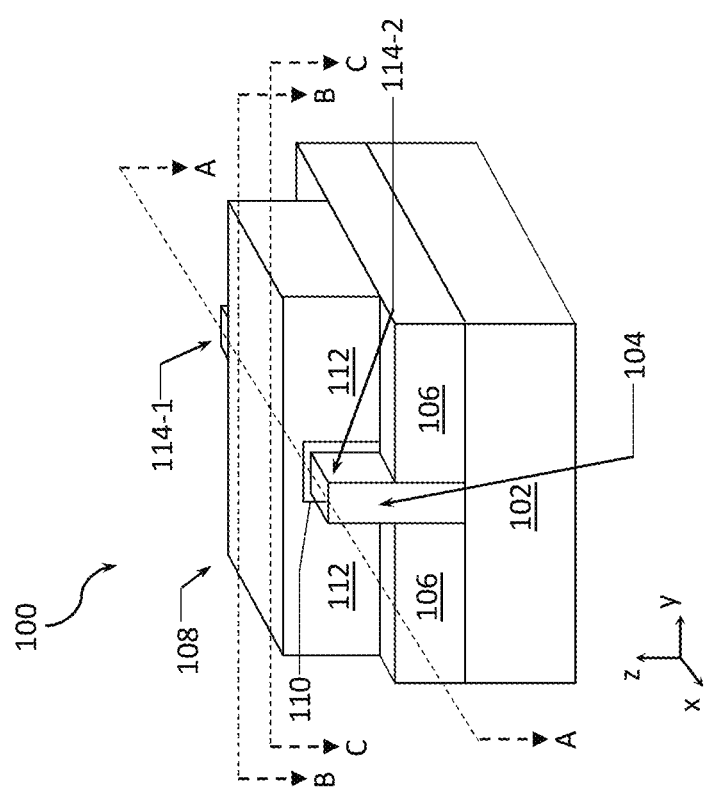
FIG. 1 is a perspective view of an example FinFET that may include a dual thickness gate dielectric, according to some embodiments of the disclosure.

For purposes of illustrating FETs with a dual thickness gate dielectric described herein, it might be useful to understand phenomena that may come into play in a transistor. The following foundational information may be viewed as a basis from which the present disclosure may be properly explained. Such information is offered for purposes of explanation only and, accordingly, should not be construed in any way to limit the broad scope of the present disclosure and its potential applications.

Performance of a FET may depend on the number of factors. Breakdown voltage of a FET is one of such factors. The breakdown voltage, commonly abbreviated as BVDS, refers to the drain-source voltage, VDS, which causes the FET to enter the breakdown region (i.e., the region where the transistor receives too much voltage across its drain-source terminal, which causes the drain-source terminal to break down, which makes the drain current, ID, drastically increase). Gate leakage of a FET is another one of such factors. Gate leakage, sometimes referred to as stress induced leakage current (SILC), refers to an increase in the gate leakage current of a MOSFET, which may occur due to defects created in the gate dielectric (typically, a gate oxide) during electrical stressing.

Increasing the breakdown voltage and decreasing the gate leakage of FETs would be desirable for a variety of applications. One example application is in I/O designs where FETs could realize ESD protection devices, described above. Another example application is in wireless radio frequency (RF) communications, in particular for mm-wave wireless technology such as fifth generation (5G) wireless (i.e., high frequency/short wavelength spectrum of RF, e.g., with frequencies in the range between about 20 and 60 GHz, corresponding to wavelengths in the range between about 5 and 15 millimeters), where FETs could realize circuits such as power amplifiers.

However, increasing the breakdown voltage and decreasing the gate leakage of FETs, especially while also having sufficiently high speed of operation, is not an easy task. Therefore, applications that require high breakdown, low leakage, high speed circuits typically resort to technologies other than silicon, such as GaN or other III-N materials. While III-N materials are very promising, it may still be desirable to implement FETs on silicon due to the cost advantage resulting from the use of known silicon processing technologies. Furthermore, for many applications, such as high-power applications or mm-wave RF connectivity, implementing FETs on silicon may advantageously enable a reduced form factor resulting from the ability to integrate high-power or RF circuits with logic circuits. Integration has many other benefits for high-power or mm-wave RF circuits as such circuits are increasingly relying on digital circuits to improve performance while supporting low latencies. Therefore, having a FET device that can sustain higher breakdown voltage, achieve sufficiently low leakage and sufficiently high speed, and be fabricated using complementary metal-oxide-semiconductor (CMOS) technology would be highly desirable.

Disclosed herein are transistor arrangements of FETs with dual thickness gate dielectrics that may advantageously allow increasing the breakdown voltage and/or decreasing the gate leakage. An example transistor arrangement includes a semiconductor channel material (which may be interchangeably referred to as a "channel material" or a "semiconductor material"), a source region and a drain region, provided in the semiconductor material, and a gate stack provided over a portion of the semiconductor material that is between the source region and the drain region. The gate stack has a thinner gate dielectric in a portion that is closer to the source region and a thicker gate dielectric in a portion that is closer to the drain region and the gate dielectric of the gate stack may, therefore, be referred to as a "dual thickness gate dielectric." Implementing the dual thickness gate dielectric makes the gate stack asymmetric in that a thickness of a gate dielectric of a portion of the gate stack closer to one of the source/drain (S/D) regions is different from that of a portion of the gate stack closer to the other S/D region. Implementing a dual thickness gate dielectric in a transistor arrangement may effectively realize tunable ballast resistance integrated with the transistor arrangement and may help increase the breakdown voltage and/or decrease the gate leakage of a FET. In various embodiments, the integrated ballast resistance may further be tuned, and, consequently, the breakdown voltage and the gate leakage may further be optimized, by selectively including, or not including, work function (WF) materials in various portions of the gate stack, varying doping concentrations of the P- and N-wells between the source and drain regions, as well as varying the dimensions of the P- and N-wells along the channel length (e.g., along a line between the source and the drain regions).

As used herein, the term "WF material" refers to any material that may be used for controlling the threshold voltage of a FET. The term "WF material" is used to indicate that it is the WF of the material (i.e., the physical property of the material specifying the minimum thermodynamic work (i.e. energy) needed to remove an electron from a solid to a point in the vacuum immediately outside the solid surface) that may affect the threshold voltage of the final FET. Further, the term "threshold voltage," commonly abbreviated as Vth, refers to the minimum gate electrode bias (or gate-source voltage) that is needed to create a conducting path (i.e., a conducting channel) between the source and the drain terminals of a transistor.

While some embodiments described herein refer to Fin-FETs (i.e., FETs having a non-planar architecture where a fin, formed of one or more semiconductor materials, extends away from a base), these embodiments are equally applicable to any other non-planar FETs besides FinFETs (e.g., to nanowire or nanoribbon transistors), as well as to FETs having planar architecture.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium arsenide" or "GaAs" may refer to a material that includes Gallium and Arsenic). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 2A-2C, such a collection may be referred to herein without the letters, e.g., as "FIG. 2." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one FET with a dual thickness gate dielectric as described herein may be implemented in one or more components associated with an IC or/and between various such components. In various embodiments, components associated with an IC include, for example, transistors, diodes, power sources, resistors, capacitors, inductors, sensors, transceivers, transmitters, receivers, antennas, etc. Components associated with an IC may include those that are mounted on an IC, provided as an integral part of an IC, or those connected to an IC. The IC may be either analog or digital, or may include a combination of analog and digital circuitry, and may be used in a number of applications, such as microprocessors, optoelectronics, logic blocks, audio amplifiers, etc., depending on the components associated with the IC. In some embodiments, IC structures that include at least one FET with a dual thickness gate dielectric as described herein may be included in a RFIC, which may, e.g., be included in any component associated with an IC of an RF receiver, an RF transmitter, or an RF transceiver, or any other RF device, e.g., as used in telecommunications within base stations (BS) or user equipment (UE) devices. Such components may include, but are not limited to, power amplifiers, RF switches, RF filters (including arrays of RF filters, or RF filter banks), or impedance tuners. In some embodiments, the IC structures that include at least one FET with a dual thickness gate dielectric as described herein may be employed as part of a chipset for executing one or more related functions in a computer.

Example FinFET with a Dual Thickness Gate Dielectric

Transistors can have planar or non-planar architecture. Recently, non-planar transistors have been extensively explored as alternatives to transistors with planar architectures.

FinFETs refer to transistors having a non-planar architecture where a fin, formed of one or more semiconductor materials, extends away from a base (where the term "base" may refer to any suitable support structure on which a transistor may be built, e.g., a substrate, a die, a wafer, or a chip). A portion of the fin that is closest to the base may be enclosed by an insulator material. Such an insulator material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode material and, optionally, a layer of a gate dielectric may be provided over the top and sides of the remaining upper portion of the fin (e.g., the portion above and not enclosed by the STI), thus wrapping around the upper-most portion of the fin. The portion of the fin over which the gate stack wraps around may be referred to as a "channel portion" of the fin because this is where, during operation of the transistor, a conductive channel may form, and is a part of an active region of the fin. A source region and a drain region are provided on the opposite sides of the gate stack, forming, respectively, a source and a drain terminal of a transistor.

FinFETs may be implemented as "tri-gate transistors," where the name "tri-gate" originates from the fact that, in use, such a transistor may form conducting channels on three "sides" of the fin. FinFETs potentially improve performance relative to single-gate transistors and double-gate transistors.

FIG. 1 is a perspective view of an IC stricture with an example FinFET 100 in which a dual thickness gate dielectric may be implemented in accordance with some embodiments of the disclosure. Note that the FinFET 100 shown in FIG. 1 is intended to show relative arrangement(s) of some of the components therein, and that the FinFET 100, or portions thereof, may include other components that are not illustrated (e.g., any further materials, such as e.g. spacer materials, surrounding the gate stack of the FinFET 100, electrical contacts to the S/D regions of the FinFET 100, etc.).

As shown in FIG. 1, the FinFET 100 may include a base 102, a fin 104, an STI material 106 enclosing the subfin portion of the fin 104, and S/D regions (also commonly referred to as "diffusion regions") 114-1 and 114-2. As also shown, the FinFET 100 also includes a gate stack 108 that includes a gate dielectric 110 and a gate electrode 112. Although not specifically shown in FIG. 1, it will be seen from, e.g., FIGS. 2-7, that the gate dielectric 110 may include two portions of different thicknesses, each of which may include a stack of one or more gate dielectric materials.

In general, implementations of the present disclosure may be formed or carried out on a support structure such as a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device implementing any of the FETs with a dual thickness gate dielectric as described herein may be built falls within the spirit and scope of the present disclosure. In various embodiments, the base 102 may include any such substrate material that provides a suitable surface for forming the FinFET 100.

As shown in FIG. 1, the fin 104 may extend away from the base 102 and may be substantially perpendicular to the base 102. The fin 104 may include one or more semiconductor materials, e.g. a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions is formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1, with a channel portion of the fin 104 corresponding to the portion of the fin 104 wrapped by the gate stack 108. In particular, the gate dielectric 110 may wrap around the upper-most portion of the fin 104, and the gate electrode 112 may wrap around the gate dielectric 110. The interface between the channel portion and the subfin portion of the fin 104 is located proximate to where the gate electrode 112 ends.

The gate electrode 112 may include one or more gate electrode materials, where the choice of the gate electrode materials may depend on whether the FinFET 100 is a P-type metal oxide semiconductor (PMOS) transistor or an N-type metal oxide semiconductor (NMOS) transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are WF materials as described herein and at least one material of the stack is a fill metal layer. Further materials/layers may be included next to the gate electrode 112 for other purposes, such as to act as a diffusion barrier layer or/and an adhesion layer.

Although not specifically shown in FIG. 1 (but will be shown in greater detail with reference to FIGS. 2-7), according to various embodiments of the present disclosure, the gate dielectric 110 includes at least two portions having different thicknesses (where thickness of a gate dielectric refers to a dimension measured in the direction of the y-axis on the sidewalls of the fin 104 and a dimension measured in the direction of the z-axis on top of the fin 104, the y- and z-axes being different axes of a reference coordinate system x-y-z shown in FIG. 1), each of which portions may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the STI material 106 which may, e.g., include any of the high-k dielectric materials described herein.

In some embodiments, the fin 104 may be composed of semiconductor material systems including, for example, N-type or P-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as e.g. Si or Ge. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example N-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for N-type devices) from the channel portion. Example materials, include, but are not limited to, GaAs, GaSb, GaAsSb, GaP, InAlAs, GaAsSb, AlAs, AlP, AlSb, and AlGaAs. In some N-type transistor embodiments of the FinFET 100 where the channel portion of the fin 104 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 104 are each, or include, group IV semiconductors (e.g., Si, Ge, SiGe). The subfin of the fin 104 may be a first elemental semiconductor (e.g., Si or Ge) or a first SiGe alloy (e.g., having a wide bandgap).

For some example P-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. The subfin of the fin 104 may be a group IV material having a band offset (e.g., valance band offset for P-type devices) from the channel portion. Example materials, include, but are not limited to, Si or Si-rich SiGe. In some P-type transistor embodiments, the subfin of the fin 104 is Si and at least a portion of the subfin may also be doped with impurities (e.g., N-type) to a higher impurity level than the channel portion.

The fin 104 may include a first source or drain (S/D) region 114-1 and a second S/D region 114-2 on respective different sides of the gate stack 108, as shown in FIG. 1, thus realizing a transistor. In some embodiments, the first S/D region 114-1 may be a source region and the second S/D region 114-2 may be a drain region, although in some embodiments this designation of source and drain may be interchanged. Although not specifically shown in FIG. 1, the FinFET 100 may further include S/D electrodes (also commonly referred to as "S/D contacts"), formed of one or more electrically conductive materials, for providing electrical connectivity to the source and drain regions 114, respectively. In some embodiments, the S/D regions 114 of the FinFET 100 (also sometimes interchangeably referred to as "diffusion regions") may be regions of doped semiconductors, e.g., regions of doped channel material of the fin 104, so as to supply charge carriers for the transistor channel. In some embodiments, the S/D regions 114 may be highly doped, e.g. with dopant concentrations of about $1.10^{21}$ $cm^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the source region 114-1 and the drain region 114-2, and, therefore, may be referred to as "highly doped" (HD) regions.

In some embodiments, the source and drain regions 114 may generally be formed using either an implantation/ diffusion process or an etching/deposition process. In the former process, dopants such as boron, aluminum, antimony, phosphorous, or arsenic may be ion-implanted into the one or more semiconductor materials of the upper portion of the fin 104 to form the source and drain regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the source and drain regions 114. In some implementations, the source and drain regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the source and drain regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the source and drain regions 114).

The FinFET 100 may have a gate length, GL, (i.e. a distance between the source region 114-1 and the drain region 114-2), a dimension measured along the fin 104 in the direction of the x-axis of the example reference coordinate system x-y-z shown in FIG. 1, which may, in some embodiments, be between about 5 and 40 nanometers, including all values and ranges therein (e.g. between about 22 and 35 nanometers, or between about 20 and 30 nanometers). The fin 104 may have a thickness, a dimension measured in the direction of the y-axis of the reference coordinate system x-y-z shown in FIG. 1, that may, in some embodiments, be between about 5 and 30 nanometers, including all values and ranges therein (e.g. between about 7 and 20 nanometers, or between about 10 and 15 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 104 illustrated in FIG. 1 is shown as having a rectangular cross section in a z-y plane of the reference coordinate system shown in FIG. 1, the fin 104 may instead have a cross section that is rounded or sloped at the "top" of the fin 104, and the gate stack 108 (including the different portions of the gate dielectric 110) may conform to this rounded or sloped fin 104. In use, the FinFET 100 may form conducting channels on three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate).

While FIG. 1 illustrates a single FinFET 100, in some embodiments, a plurality of FinFETs may be arranged next to one another (with some spacing in between) along the fin 104.

Example FinFETs with Dual Thickness Gate Dielectrics

FIGS. 2A-2C are cross-sectional side views of a transistor 200, which provides the first example of the FinFET 100 shown in FIG. 1. Thus, descriptions provided with respect to FIG. 1 are applicable to FIGS. 2A-2C and, therefore, in the interests of brevity, are not repeated. The cross-sectional side view of FIG. 2A is the view in the x-z plane of the example coordinate system shown in FIG. 1 with the cross section taken along the fin 104 (e.g., along the plane shown in FIGS. 1, 2B, and 2C as a plane AA). The cross-sectional side view of FIG. 2B is the view in the y-z plane of the example coordinate system shown in FIG. 1 with the cross section taken across the fin 104 for one example portion of the gate stack 108 (e.g., along the plane shown in FIG. 1 and in FIG. 2A as a plane BB). The cross-sectional side view of FIG. 2C is the view in the y-z plane of the example coordinate system shown in FIG. 1 with the cross section taken across the fin 104 for another example portion of the gate stack 108 (e.g., along the plane shown in FIG. 1 and in FIG. 2A as a plane CC). A legend provided within a dashed box at the bottom of FIG. 2 illustrates colors/patterns used to indicate some portions or materials of some of the elements shown in FIG. 2, so that FIG. 2 is not cluttered by too many reference numerals. For example, FIG. 2 uses different colors/patterns to identify the base 102, the fin 104, the STI 106, the S/D regions 114, S/D contacts 216 (which may include a first S/D contact 216-1 to the source region 114-1 and a second S/D contact 216-2 to the drain region 114-2), etc.

As shown in FIG. 2, the gate dielectric 110 of the gate stacks 108 may include a first gate dielectric 110-1 and a second gate dielectric 110-2. As used herein, the differentiation between the first gate dielectric 110-1 and the second gate dielectric 110-2 is made in that these dielectric materials have different thicknesses, in particular, the first gate dielectric 110-1 being a portion of the gate dielectric 110 of the gate stack 108 that is thinner than a portion of the gate dielectric 110 represented by the second gate dielectric 110-2. In various embodiment, the material compositions of the first gate dielectric 110-1 and the second gate dielectric 110-2 may be the same or may be different, or the thicker portion of the gate dielectric (i.e., the second gate dielectric 110-2) may include a layer having one composition of one or more dielectric materials, and a layer having a composition of one or more dielectric materials of the thinner portion of the gate dielectric (i.e., of the first gate dielectric 110-1). Thus, in various embodiments, each of the first gate dielectric 110-1 and the second gate dielectric 110-2 may include any of the gate dielectric materials described above, and may be seen as being in contact with one another, e.g., as being a continuous layer of one or more gate dielectric materials with different portions of the layer having different thicknesses. In some embodiments, a dielectric constant of the second gate dielectric 110-2 (i.e., the thicker gate dielectric) may be smaller than a dielectric constant of the first gate dielectric 110-1 (i.e., the thinner gate dielectric), e.g., at least 2 times smaller, at least 5 times smaller, or even 6-7 times smaller. Such embodiments may be advantageous in terms of channel control and performance and at the same time providing a robust gate dielectric in the region most prone to breakdown.

In some embodiments, as shown in FIG. 2A, the first gate dielectric 110-1 may be closer to the source region 114-1 than the second gate dielectric 110-2, while the second gate dielectric 110-2 may be closer to the drain region 114-2 than the first gate dielectric 110-1. Thus, the thickness of the portion of the gate dielectric 110 that is closest to the drain region 114-2 may be larger than the thickness of the portion of the gate dielectric 110 that is closest to the source region 114-1. For example, in some embodiments, the thickness of the second gate dielectric 110-2 may be between about 1.1 and 5 times larger than the thickness of the first gate dielectric 110-1 (e.g., about 2 times or about 3 times larger).

As also shown in FIG. 2, the gate electrode 112 of the gate stacks 108 may be seen as including a first gate electrode material/portion 112-1 and a second gate electrode material/portion 112-2. As used herein, the differentiation between the first gate electrode material/portion 112-1 and the second gate electrode material/portion 112-2 is made in that these gate electrode materials/portions are provided over first and second gate dielectrics 110-1, 110-2, respectively. In some embodiments, the gate electrode portions 112-1 and 112-1 may include materials of the same or different composition. For example, in some embodiments, both the gate electrode material 112-1 over the thinner gate dielectric 110-1 and the gate electrode material 112-2 over the thicker gate dielectric 110-2 may include a layer of a WF material over the respective gate dielectric 110 and a layer of a fill metal layer (thus, a layer of a WF material may be between the fill metal layer and the respective gate dielectric 110). In some such embodiments, the layer of a WF material may include the same WF material over both the first and second gate dielectrics 110-1, 110-2. In other such embodiments, the layer of a WF material over the first and second gate dielectrics 110-1, 110-2 may include WF materials of different material compositions. For example, in some embodiments, the WF materials over the first and second gate dielectrics 110-1, 110-2 may be WF materials associated with different threshold voltages, meaning that, if a given transistor would include a first WF material as the gate electrode material 112-1, such a transistor would have a first threshold voltage, and, if an otherwise the same transistor would include the second WF material as the gate electrode material 112-2, such a transistor would have a second threshold voltage, different from the first threshold voltage. In some such embodiments, the WF material provided over the first gate dielectric 110-1 (i.e., the WF material closer to the source region 114-1) may be a WF material associated with a lower threshold voltage, while the WF material provided over the second gate dielectric 110-2 (i.e., the WF material closer to the drain region 114-2) may be a WF material associated with a higher threshold voltage. This may help in providing a bigger drive current for the transistor, which can offset the higher drain ballast resistance from the extended drain portion. For example, in some embodiments, the WF material of the gate electrode portion 112-1 may be associated with a threshold voltage between about 0.1 and 0.25 volts, while the WF material of the gate electrode portion 112-2 may be associated with a threshold voltage between about 0.6 and 4 volts.

In other embodiments, the second gate electrode portion 112-2, i.e., the portion closer to the drain region 114-2, may include only a fill metal layer, such as copper, but no WF material, while the gate electrode portion 114-1 may include a WF material (e.g., any of the materials described above) and then a fill metal layer over the WF material. Such embodiments may be advantageous in terms of, e.g., process complexity in the gate stack and obtaining a better WF metal uniformity at the transition between 112-1 and 112-2 regions.

Turning to further details of the dual thickness dielectric 100, the first gate dielectric 110-1 may be seen as provided over a first portion of the semiconductor material of the fin 104, while the second gate dielectric 110-2 may be seen as provided over a second portion of the semiconductor material of the fin 104. The first portion of the semiconductor material of the fin 104 is denoted in FIG. 2A as a portion 204-1, which may be, e.g., the upper-most portion of the fin 104. The second portion of the semiconductor material of the fin 104 is denoted in FIG. 2A as a portion 204-2, which may also be, e.g., the upper-most portion of the fin 104. Thus, the first portion 204-1 may be between the source region 114-1 and the second portion 204-2, while the second portion 204-2 may be between the first portion 204-1 and the drain region 114-2). A dimension 228-1, shown in FIG. 2A, refers to the length of the first portion 204-1, while a dimension 228-2, also shown in FIG. 2A, refers to the length of the second portion 204-2.

FIG. 2A illustrates an extended drain transistor embodiment of the FET 100, meaning that there is also a third portion 204-3 of the semiconductor material of the fin 104, having a length 228-3, shown in FIG. 2A, where the third portion 204-3 is a portion of the fin 104 that is between the second portion 204-2 and the drain region 114-2. In other words, the third portion 204-3 refers to the portion of the fin 104 that is not under the gate stack 108 and that is closest to the drain region 114-2.

In some embodiments, a ratio between a length of the second portion of the channel material (i.e., the dimension 228-2 shown in FIG. 2A, measured along the x-axis, e.g., along the length of the fin 104) and a length of the first portion of the channel material (i.e., the dimension 228-1 shown in FIG. 2A, measured along the x-axis as well) may be equal to or less than about 1, e.g., equal to or less than about ½, or equal to or less than about ⅓. In other words, in some embodiments, a ratio of the length of the thick gate dielectric (i.e., the length 228-2 of the second gate dielectric 110-2) to the length of the thin gate dielectric (i.e., the length 228-1 of the first gate dielectric 110-1) may be equal to or less than about 1, e.g., equal to or less than about ½, or equal to or less than about ⅓. Including, in the gate stack 108, a thicker portion of the gate dielectric near the drain region 114-2 (i.e., the gate dielectric portion of the length 228-1) that is shorter than a thinner portion of the gate dielectric near the source region 114-1 (i.e., the gate dielectric portion of the length 228-1) may be advantageous in some deployment scenarios. Turning to the extended drain transistor feature of the transistor 200, the length 228-3 may be between about 0 and 1000 nanometers, including all values and ranges therein, e.g., between about 10 and 500 nanometers.

Besides providing a dual thickness gate dielectric, another way to tune the ballast resistance integrated in a FET is to modify the extent of P- and N-wells of the semiconductor channel material, where the terms "P-well" and "N-well" refer to portions of the channel material between the source region 114-1 and the drain region 114-2 that have P-type dopants and N-type dopants, respectively, in dopant concentrations between about $1 \times 10^{16}$ and about $1 \times 10^{18}$ dopant atoms per cubic centimeter. P- and N-wells are shown in FIG. 2A as portions of the fin 204 with patterns 224-1 and 224-2. If the transistor 200 is an NMOS transistor, the first well 224-1 is a P-well (i.e., has P-type dopants), the second well 224-2 is an N-well (i.e., has N-type dopants), and the source and drain regions 114 include N-type dopants but in higher dopant concentration than the wells 224 (as is clear from the dopant concentration examples provided above). If the transistor 200 is a PMOS transistor, the first well 224-1 is an N-well, the second well 224-2 is a P-well, and the source and drain regions 114 include P-type dopants but in higher dopant concentration than the wells 224. In general, for a given type of a transistor (e.g., NMOS or a PMOS transistor) the first well 224-1 is a portion of the semiconductor material of the fin 204 that includes dopants of the first type (e.g., P-type dopants) in dopant concentrations between about $1 \times 10^{16}$ and about $1 \times 10^{18}$ dopant atoms per cubic centimeter, the second well 224-2 is a portion of the semiconductor material of the fin 204 that includes dopants of the second type (e.g., N-type dopants) in dopant concentrations between about $1 \times 10^{16}$ and about $1 \times 10^{18}$ dopant atoms per cubic centimeter, and the source and drain regions 114 are regions that include dopants of the second type (i.e., the same as the second well 224-2), but in higher dopant concentrations, e.g., above at least about $1 \times 10^{21}$ dopant atoms per cubic centimeter.

In the example of the transistor 200 illustrated in FIGS. 2A-2C, the first and second wells 224-1, 224-2 are substantially aligned with the first and second gate dielectrics 110-1, 110-2, respectively. In other words, for the transistor 200, the first well 224-1 extends from the source region 114-1 under the first gate dielectric 110-1 and ends where the second gate dielectric 110-2 begins. The second well 224-2 may then begin where the first well 224-ends and extend under the second gate dielectric 110-2, and for the extended drain transistor embodiments as shown in FIG. 2A, the second well 224-2 may extend all the way to the drain region 114-2. Phrased differently, in the example of the transistor 200, the portion of the semiconductor material of the fin 104 that is below the thinner gate dielectric 110-1, i.e., the portion 204-1, is a well portion with dopants of the first type (e.g., P-type dopants), and the portion of the semiconductor material of the fin 104 that is below the thicker gate dielectric 110-2, i.e., the portion 204-2, is a well portion with dopants of the second type (e.g., N-type dopants) (while, again, the source and drain regions 114 include dopants of the second type). In some such embodiments, a portion of the semiconductor material between the second portion 204-2 and the drain region 114-2, i.e., the third portion 204-3, may also include dopants of the second type (e.g., N-type dopants), i.e., the second well 224-2 extends all the way to the extended drain 114-2 of the transistor 200. The embodiment of the transistor 200 where the first and second wells 224-1, 224-2 are substantially aligned with the first and second gate dielectrics 110-1, 110-2, respectively, may be advantageous in terms of ease of fabrication and process cost.

FIGS. 3-7 illustrate transistors 300, 400, 500, 600, and 700, which are further examples of the FinFET 100 shown in FIG. 1. In particular, each of FIGS. 3-5 illustrates a transistor similar to the transistor 200, shown in FIG. 2, but with different alignment of the first and second wells 224-1 and 224-2, while each of FIGS. 6-7 illustrates a transistor similar to the transistor 200, shown in FIG. 2, but with different alignment of the drain region 114-2 with respect to the end of the second gate dielectric 110-2. Thus, descriptions provided with respect to FIG. 2 are applicable to FIGS. 3-7 and, therefore, in the interests of brevity, are not repeated, and only the differences are described.

FIG. 3 illustrates an embodiment where the first well 224-1 the first well 224-1 extends from the source region 114-1 under the first gate dielectric 110-1, but does not end where the second gate dielectric 110-2 begins, as was the case in FIG. 2, but instead extends under the second gate dielectric 110-2 and ends where the second gate dielectric 110-2 ends. Since the transistor 300 is also an extended drain transistor, the second well 224-2 may then begin where the first well 224-ends, i.e., where the second gate dielectric 110-2 ends, and extend all the way to the drain region 114-2. Phrased differently, in the example of the transistor 300, both the portion of the semiconductor material of the fin 104 that is below the thinner gate dielectric 110-1, i.e., the portion 204-1, and the portion of the semiconductor material of the fin 104 that is below the thicker gate dielectric 110-2, i.e., the portion 204-2 are well portions with dopants of the first type (e.g., P-type dopants), while a portion of the semiconductor material between the second portion 204-2 and the drain region 114-2, i.e., the third portion 204-3, includes dopants of the second type (e.g., N-type dopants) (while, again, the source and drain regions 114 include dopants of the second type). The embodiment of the transistor 300 where the first well 224-1 extends under both of the first and second gate dielectrics 110-1, 110-2 may be advantageous where a longer channel may be needed, e.g., in cases where a smaller poly-pitch is chosen. This could enable a higher drain voltage to be applied without causing a high drain-source leakage.

FIG. 4 illustrates an embodiment of the transistor 400 similar to the transistor 300 where the first well 224-1 extends from the source region 114-1 under the first gate dielectric 110-1, and, similar to FIG. 3, does not end where the second gate dielectric 110-2 begins, but continues to extend under the second gate dielectric 110-2. In contrast to FIG. 3, the first well 224-1 ends before the second gate dielectric 110-2 ends. For example, in some embodiments, the first well 224-1 may extend through all of the first portion 204-1 and through about 50% of the portion 204-2 of the channel length below the second gate dielectric 110-2. Since the transistor 300 is also an extended drain transistor, the second well 224-2 may then begin where the first well 224-ends, i.e., under the second gate dielectric 110-2, and extend all the way to the drain region 114-2. Phrased differently, in the example of the transistor 400, the portion of the semiconductor material of the fin 104 that is below the thinner gate dielectric 110-1, i.e., the portion 204-1, and some of the portion of the semiconductor material of the fin 104 that is below the thicker gate dielectric 110-2, i.e., some of the portion 204-2, are well portions with dopants of the first type (e.g., P-type dopants), while the remaining portion of the portion 204-2, as well as a portion of the semiconductor material between the second portion 204-2 and the drain region 114-2, i.e., the third portion 204-3, includes dopants of the second type (e.g., N-type dopants) (while, again, the source and drain regions 114 include dopants of the second type). Depending on the use case, the embodiment of the transistor 400 where the first well 224-1 extends under both of the first and second gate dielectrics 110-1, 110-2 but ends under the second gate dielectric 110-2 may be advantageous when the device is required to conduct sufficiently high current during ESD events and at the same time provide enough series resistance to drop the drain voltage to preserve integrity of the gate oxide.

FIG. 5 illustrates an embodiment of the transistor 500 similar to the transistor 400 in that the first well 224-1 ends under a gate dielectric (i.e., is not aligned with one of the gate dielectrics as in the transistors 200 or 300). In contrast to the transistor 400, in the transistor 500 the first well 224-1 ends already under the first gate dielectric 110-1. Thus, as shown in FIG. 5, in the transistor 500, the first well 224-1 extends from the source region 114-1 under the first gate dielectric 110-1, ends before the first gate dielectric 110-1 ends, at which point the second well 224-2 begins and continues all the way until the drain region 114-2. For example, in some embodiments, the first well 224-1 may extend through about 50% of the first portion 204-1 of the channel length below the first gate dielectric 110-1. The second well 224-2 may then extend through the remaining portion of the first portion 204-1 and through all of the second portion 204-2 of the channel length below the second gate dielectric 110-2. Since the transistor 500 is also an extended drain transistor, the second well 224-2 may then continue to extend all the way to the drain region 114-2. Phrased differently, in the example of the transistor 500, some of the portion of the semiconductor material of the fin 104 that is below the thinner gate dielectric 110-1, i.e., some of the portion 204-1, is a well portion with dopants of the first type (e.g., P-type dopants), while the remainder of the first portion 204-1 and all of the semiconductor material of the fin 104 that is below the thicker gate dielectric 110-2, i.e., all of the portion 204-2, as well as a portion of the semiconductor material between the second portion 204-2 and the drain region 114-2, i.e., the third portion 204-3, includes dopants of the second type (e.g., N-type dopants) (while, again, the source and drain regions 114 include dopants of the second type). Depending on the use case, the embodiment of the transistor 500 may be advantageous when the device is required to conduct sufficiently high current during ESD events and at the same time provide enough series resistance to drop the drain voltage to preserve integrity of the gate oxide.

FIG. 6 illustrates an embodiment where the transistor 600 is similar to the transistor 200, shown in FIG. 2, but in the transistor 600 the drain region 114-2 is extended to where the second gate dielectric 110-2 ends. Thus, effectively, the third portion 204-3 of the transistor 200 is replaced with the drain region 114-2 in the transistor 600. In the embodiment of the transistor 600 shown in FIG. 6, the first and second wells 224-1 and 224-2 are aligned with the first and second portions 204-1 and 204-2, as can be seen in FIG. 6. However, in other embodiments of the transistor 600, not shown in the present figures, the first and second wells 224-1 and 224-2 may end under one of the first or second gate dielectrics 110-1, 110-2, as was described with reference to FIGS. 4 and 5, which embodiments are also within the scope of the present disclosure. One advantage an extended heavily doped drain epitaxy material 114-2 may be to allow the device to conduct sufficiently high current during ESD events before breakdown.

FIG. 7 illustrates an embodiment where the transistor 700 is similar to the transistor 200, shown in FIG. 2, but in the transistor 700 the second gate dielectric 110-2 and, hence, the second portion 204-2 is extended to the drain region 114-2. Thus, effectively, the third portion 204-3 of the transistor 200 is replaced with the second portion 204-2 in the transistor 700. In the embodiment of the transistor 700 shown in FIG. 7, the first and second wells 224-1 and 224-2 are aligned with the first and second portions 204-1 and 204-2, as can be seen in FIG. 7. However, in other embodiments of the transistor 700, not shown in the present figures, the first and second wells 224-1 and 224-2 may end under one of the first or second gate dielectrics 110-1, 110-2, as was described with reference to FIGS. 4 and 5, which embodiments are also within the scope of the present disclosure.

Other FETs with Dual Thickness Gate Dielectrics

As briefly described above, dual thickness gate dielectrics as described herein may be implemented in FET of any desired architecture. Wrap-around or all-around gate transistors, such as nanoribbon and nanowire transistors, provide other examples of transistors having a non-planar architecture.

Figure 8:
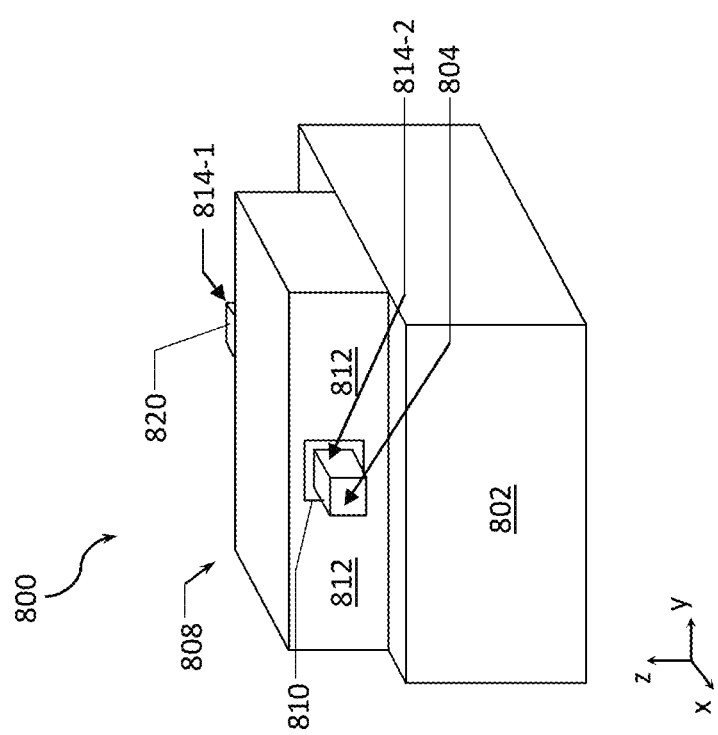
FIG. 8 is a perspective view of an example nanowire FET that may include a dual thickness gate dielectric, according to some embodiments of the disclosure.

FIG. 8 is a perspective view of an example all-around gate transistor 800 which may include a dual thickness gate dielectric in accordance with various embodiments described herein. The transistor 800 may include a channel material formed as a nanowire 804 made of one or more semiconductor materials, the nanowire 804 provided over a base 802. The nanowire 804 may take the form of a nanowire or nanoribbon, for example. A gate stack 808 including a gate electrode 812 and a dielectric 810 may wrap entirely or almost entirely around the wire 804 as shown in FIG. 8, with the active region of the channel material of the nanowire 804 corresponding to the portion of the wire 804 wrapped by the gate stack 808. In particular, the gate dielectric 810 may wrap around the nanowire 804 and the gate electrode 812 may wrap around the gate dielectric 810. In some embodiments, the gate stack 808 may fully encircle the nanowire 804. In some embodiments, a layer of oxide material (not specifically shown in FIG. 8) may be provided between the base 802 and the gate electrode 810. The nanowire 804 may include a drain region 814-1 and a source region 814-2 on the opposite sides of the gate stack 808, as shown in FIG. 8. The base 802, the channel material of the nanowire 804, the gate stack 808, the gate dielectric 810, the gate electrode 812, the source region 814-1 and the drain region 814-2 of the transistor 800 shown in FIG. 8 are analogous to the base 102, the channel material of the fin 104, the gate stack 108, the gate dielectric 110, the gate electrode 112, the source region 114-1 and the drain region 114-2 of the FinFET 100 shown in FIG. 1 and of the example embodiments of the FinFET 100 discussed with reference to FIGS. 2-7, except that in FIG. 8 the nanowire 804 is used instead of the fin 104. Therefore, descriptions of these elements provided with reference to FIGS. 1-7 are applicable to FIG. 8, and, therefore, in the interests of brevity, are not repeated.

Although not specifically illustrated in FIG. 8, a dielectric spacer may be provided between the source electrode and the gate stack as well as between the transistor drain electrode and the gate stack of the all-around-gate transistor 800 in order to provide electrical isolation between the source, gate, drain electrodes, similar to the spacer described above for the FinFET 100.

Furthermore, although the nanowire 804 illustrated in FIG. 8 is shown as having a rectangular cross section, the nanowire 804 may instead have a cross section that is rounded or otherwise irregularly shaped, and the gate stack may conform to the shape of the nanowire 804. In use, the all-around-gate transistor 800 may form conducting channels on more than three "sides" of the nanowire 804, potentially improving performance relative to FinFETs. Although FIG. 8 depicts an embodiment in which the longitudinal axis of the nanowire 804 runs substantially parallel to a plane of the base 802, this need not be the case; in other embodiments, the nanowire 804 may be oriented, e.g., "vertically" so as to be perpendicular to a plane of the base 802.

In some embodiments, multiple all-around-gate transistors similar to that shown in FIG. 8 may be provided along a single wire such as the nanowire 804, with considerations relevant to providing multiple devices on a single wire being known in the art and, therefore, in the interests of brevity, not specifically described here.

The transistor arrangements such as the FinFETs 100 illustrated in FIGS. 1-7 and all-around-gate transistors 800 illustrated in FIG. 8, and different variations of such arrangements, as described above, do not represent an exhaustive set of transistor arrangements in which a dual thickness gate dielectric may be implemented but merely provide examples of such arrangements. For example, in further embodiments, transistors with dual thickness gate dielectrics may be transistors having planar architecture. Although particular arrangements of materials are discussed with reference to FIGS. 1-8, intermediate materials may be included in the transistor devices of these figures. Note that FIGS. 1-8 are intended to show relative arrangements of the components therein, and that transistor arrangements of these figures may include other components that are not illustrated (e.g., various spacer materials or various interfacial layers). Additionally, although various components of the transistor arrangements are illustrated in FIGS. 1-8 as being planar rectangles or formed of rectangular solids, this is simply for ease of illustration, and embodiments of these transistors may be curved, rounded, or otherwise irregularly shaped as dictated by, and sometimes inevitable due to, the manufacturing processes used to fabricate various components.

Example Devices Implementing FETs with Dual Thickness Gate Dielectrics

Figure 9A:
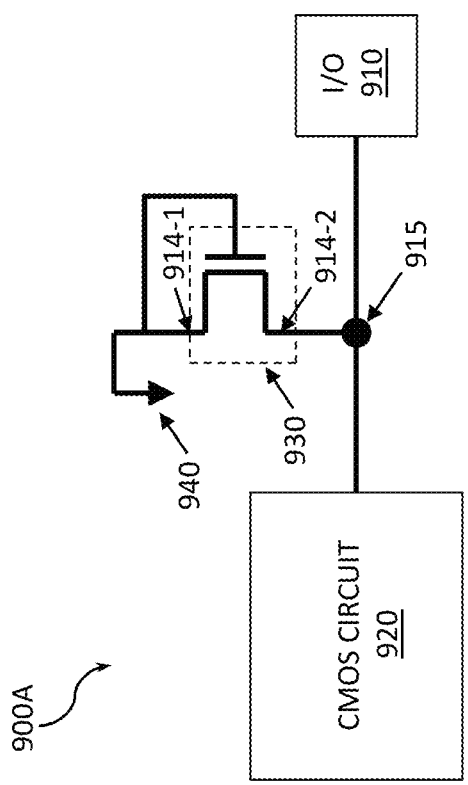

FIGS. 9A-9C are schematic circuit diagrams of electronic devices 900A, 900B, and 900C, each of which implements a FET 930 with a dual thickness gate dielectric, configured for ESD protection, according to some embodiments of the disclosure. The FET 930 may be any of the transistors with a dual thickness gate dielectric as described herein, e.g., any of the embodiments of the FinFET 100 as described with reference to FIGS. 1-7, any of the embodiments of the nanowire 800 as shown in FIG. 8, any further embodiments of the FinFET 100 and/or the nanowire FET 800 as described herein, or any other (e.g., planar) implementations of FETs as described herein.

Each of FIGS. 9A-9C provides a schematic of the FET 930 with a dual thickness gate dielectric, e.g., a non-planar MOSFET such as any of the FinFETs 100 or nanowire transistors 800 described herein, configured for ESD protection of a CMOS circuit 920 coupled to an I/O pad/driver 910, in accordance with some embodiments of the disclosure. The CMOS circuit 920 may include any core CMOS circuitry, such as but not limited to, microprocessor logic gates, memory cells, etc. As shown in FIG. 9A, the CMOS circuit 920 is electrically connected to an I/O 910, through which the CMOS circuit 920 may interface with devices external to the IC chip on which the CMOS circuit 920 is implemented. The I/O 910 may be any conventional I/O pad, pin, post, wire, etc. The FET 930 may serve as an ESD protection device by being electrically connected to a circuit node 915 disposed between the CMOS circuitry 902 and the I/O 910. In the exemplary embodiment illustrated in FIGS. 9A-9C, the FET 930 is in a GGNMOS configuration. In this configuration, in normal operating mode, the ESD protection device that is the FET 930 remains in an "off-state" with the channel region of the FET 930 conducting very little leakage current because of the grounded gate electrode 112 being present. As shown in each of FIGS. 9A-9C, a source region 914-1 of the FET 930 may be electrically connected to the gate of the FET 930, and both be connected to a ground potential 940, e.g., Vss, while a drain region 914-2 of the FET 930 may be electrically coupled to the circuit node 915 disposed between the CMOS circuitry 902 and the I/O 910. The source and drain regions 914-1, 914-2 of the FET 930 are analogous to the source and drain regions 114-1 and 114-2 of the FinFETs 100 described above or the source and drain regions 814-1 and 814-2 of the nanowire transistors 800 described above.

FIGS. 9B and 9C illustrate embodiments where the CMOS circuit 920 may be a receiver, e.g., an RF receiver. In the embodiment of FIG. 9B, the FET 930 may considered to be a stand-alone GGNMOS, used with gate and source connected to ground node and drain connected to the exposed I/O pin/pad 910. In the embodiment of FIG. 9C, the FET 930 is a GGNMOS that may also be used as a trigger for a Silicon Controlled Rectifier (SCR) 960 which may be used for ESD protection, where, in some embodiments, a combination of the FET 930 and the SCR 960 may be used in conjunction with a diode 970 for ESD protection. As shown in FIG. 9C, one port of the SCR 960 may be coupled to the drain region 914-2 of the FET 930, another port of the SCR 960 may be coupled to each of the CMOS circuit 920 and the I/O pin/pad 910, while the third port of the SCR 960 may be coupled to the ground node/potential 940. As also shown in FIG. 9C, the diode 970 may be coupled between the I/O pin/pad 910 and the ground node/potential 940.

Each of FIGS. 9B and 9C further illustrate an optional rail clamp 950, which may be configured to sink current to ground in the event of a ESD spike. Each of FIGS. 9B and 9C further illustrate an optional capacitor 955, which may be configured to sink current to ground in the event of a ESD spike.

Example Method of Manufacturing

Figure 10:
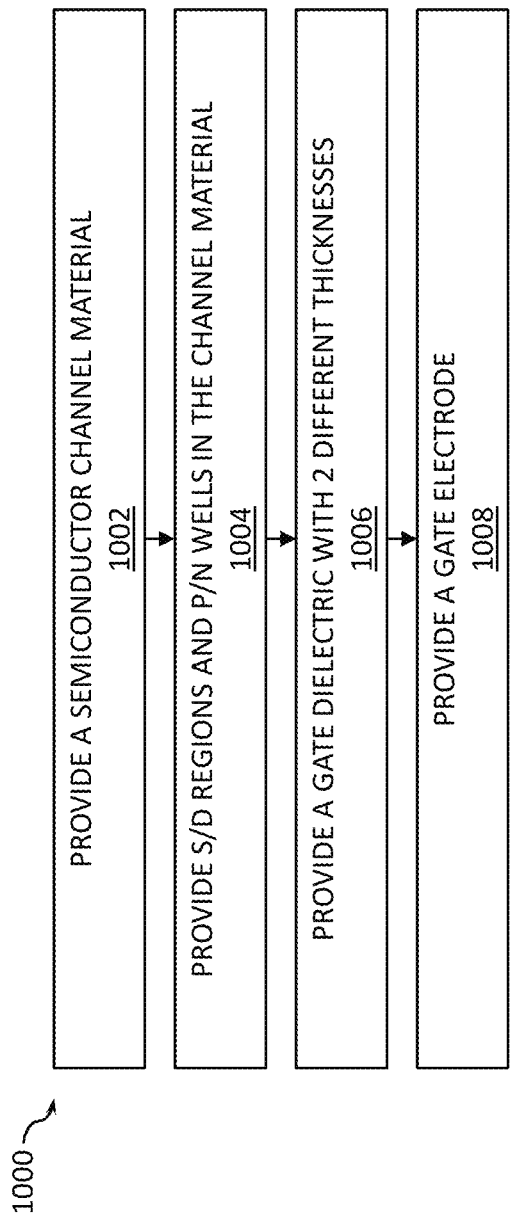
FIG. 10 is a flow diagram of an example method of manufacturing an IC structure with a FET having a dual thickness gate dielectric, according to some embodiments of the disclosure.
Figure 11:
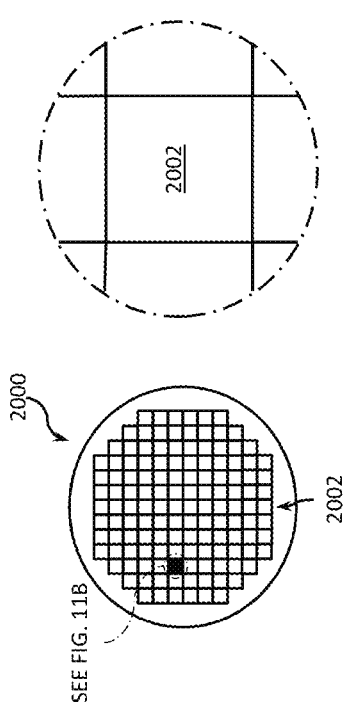
FIGS. 11A-11B are top views of a wafer and dies that include one or more FETs with dual thickness gate dielectrics in accordance with any of the embodiments of the present disclosure.

The IC structures implementing one or more transistor arrangements with at least one FET with a dual thickness gate dielectric according to various embodiments described herein may be manufactured using any suitable techniques. FIG. 10 illustrates one example of such a method. However, other examples of manufacturing any of the FETs with dual thickness gate dielectrics as described herein, as well as larger devices and assemblies that include such structures (e.g., as shown in FIGS. 11-15) are also within the scope of the present disclosure.

FIG. 10 is a flow diagram of an example method 1000 of manufacturing a transistor arrangement that includes a FET with a dual thickness gate dielectric in accordance with various embodiments of the present disclosure.

Although the operations of the method 1000 are illustrated once each and in a particular order, the operations may be performed in any suitable order and repeated as desired. For example, one or more operations may be performed in parallel to manufacture, substantially simultaneously, multiple FETs with dual thickness gate dielectrics as described herein. In another example, the operations may be performed in a different order to reflect the structure of a particular device assembly in which one or more FETs with dual thickness gate dielectrics as described herein will be included.

In addition, the example manufacturing method 1000 may include other operations not specifically shown in FIG. 10, such as various cleaning or planarization operations as known in the art. For example, in some embodiments, the base 102/802, as well as layers of various other materials subsequently deposited thereon, may be cleaned prior to, after, or during any of the processes of the method 1000 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the transistor structures/assemblies described herein may be planarized prior to, after, or during any of the processes of the method 1000 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

In various embodiments, any of the processes of the method 1000 may include any suitable patterning techniques, such as photolithographic or electron-beam (e-beam) patterning, possibly in conjunction with a suitable etching technique, e.g., a dry etch, such as reactive ion etch (RIE) or inductively coupled plasma (ICP) RIE. In various embodiments, any of the etches performed in the method 1000 may include an anisotropic etch, using etchants in a form of e.g., chemically active ionized gas (i.e., plasma) using e.g., bromine (Br) and chloride (Cl) based chemistries. In some embodiments, during any of the etches of the method 1000, the IC structure may be heated to elevated temperatures, e.g., to temperatures between about room temperature and 200 degrees Celsius, including all values and ranges therein, to promote that byproducts of the etch are made sufficiently volatile to be removed from the surface.

The method 1000 may begin with providing a semiconductor channel material for the future transistor (process 1002 shown in FIG. 10). The channel material provided in 1002 may be one or more semiconductor materials for the channel portion of the fin 104 or one or more semiconductor materials for the nanowire 804 described above. The process 1002 may include corresponding processes to shape the channel material in accordance with a particular transistor architecture of the FET being fabricated, e.g., to shape the channel material as a fin extending away from a base, or to shape the channel material as a nanowire/nanoribbon. In some embodiments, the process 1002 may include epitaxially growing one or more semiconductor materials to provide the channel material. In this context, "epitaxial growth" refers to the deposition of crystalline overlayers in the form of the desired materials. For example, the epitaxial growth of one or more layers of the process 1002 may be carried out using any known gaseous or liquid precursors for forming the desired material layers.

The method 1000 may then proceed with providing S/D regions and P/N wells in the channel material provided in 1002 (process 1004 shown in FIG. 10). The S/D regions provided in 1004 may be the source region 114-1 and the drain region 114-2 as described above for the FinFETs 100, and the source region 814-1 and the drain region 814-2 as described above for the nanowire transistors 800. Various techniques for providing S/D regions have been described above and include, e.g., either an implantation/diffusion process or an etching/deposition process. The P/N wells provided in 1004 may be the first well 224-1 and the second well 224-2 as described above for the FinFETs 100. In some embodiments, the P/N wells may be provided in 1004 using any of the techniques for providing S/D regions that have been described above, except for the differences in dopant concentration between the P/N wells and the S/D regions, as described above. In other embodiments, the P/N wells may be provided in 1002 when the channel material is provided.

The method 1000 may then include providing, over a portion of the channel material provided in 1002 between the S/D regions provided in 1004, a gate dielectric of the future gate stack, where the gate dielectric includes different portions having different thicknesses (process 1006 shown in FIG. 10). The gate dielectric provided in 1006 may include the first gate dielectric 110-1 and the second gate dielectric 110-2 as described above. Any suitable deposition techniques may be used to deposit one or more dielectric materials of the first gate dielectric 110-1 and the second gate dielectric 110-2, such as, but not limited to, spin-coating, dip-coating, atomic layer deposition (ALD), physical vapor deposition (PVD) (e.g., evaporative deposition, magnetron sputtering, or e-beam deposition), or chemical vapor deposition (CVD).

The method 1000 may include providing, over the gate dielectric provided in 1006, a gate electrode of the future gate stack (process 1008 shown in FIG. 10). The gate electrode provided in 1008 may include the first gate electrode material 112-1 and the second gate electrode material 112-2 as described above. Any suitable deposition techniques may be used to deposit one or more gate electrode materials in 1008, such as, but not limited to, ALD, PVD, CVD, or electroplating.

Example Structures and Devices

IC structures, or transistor arrangements, that include one or more FETs with dual thickness gate dielectrics as disclosed herein may be included in any suitable electronic device. FIGS. 11-15 illustrate various examples of devices and components that may include at least one FET with a dual thickness gate dielectric as disclosed herein.

FIGS. 11A-11B are top views of a wafer 2000 and dies 2002 that may include at least one FET with a dual thickness gate dielectric in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 12. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including at least one FET with a dual thickness gate dielectric as described herein). After the fabrication of the semiconductor product is complete (e.g., after manufacture of at least one FET with a dual thickness gate dielectric as described herein, e.g., after manufacture of any embodiment of the IC structures of transistor arrangements shown in FIGS. 1-9, or any further embodiments of these structures described herein), the wafer 2000 may undergo a singulation process in which each of the dies 2002 is separated from one another to provide discrete "chips" of the semiconductor product. In particular, devices that include at least one FET with a dual thickness gate dielectric as disclosed herein may take the form of the wafer 2000 (e.g., not singulated) or the form of the die 2002 (e.g., singulated). The die 2002 may include at least one FET with a dual thickness gate dielectric (e.g., one or more FinFETs 100 or one or more nanowire transistors 800 as described herein), as well as, optionally, supporting circuitry to route electrical signals to the at least one FET with a dual thickness gate dielectric, as well as any other IC components. In some embodiments, the wafer 2000 or the die 2002 may implement an RF FE device, a memory device (e.g., a static random access memory (SRAM) device), a logic device (e.g., an AND, OR, NAND, or NOR gate), or any other suitable circuit element. Multiple ones of these devices may be combined on a single die 2002.

Figure 12:
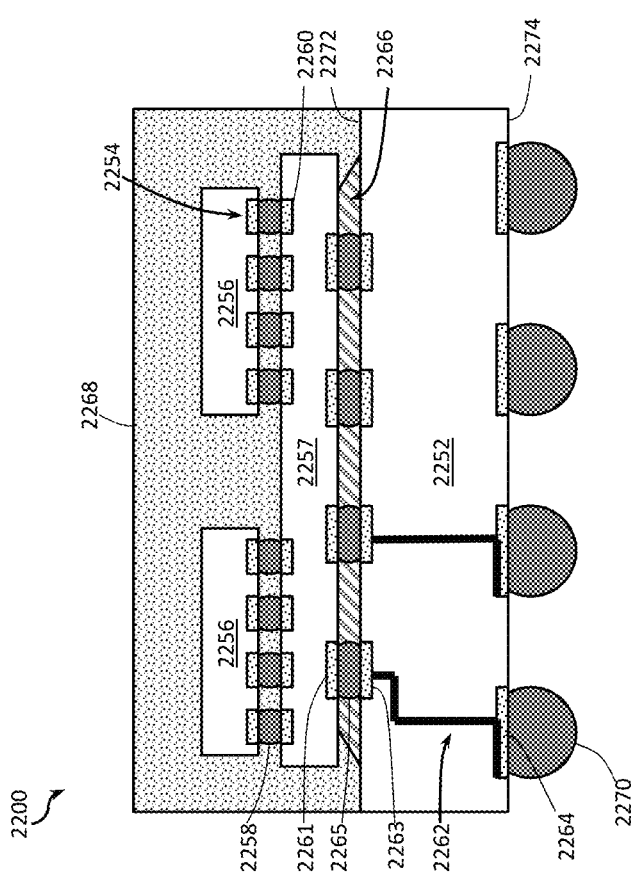
FIG. 12 is a cross-sectional side view of an IC package that may include one or more FETs with dual thickness gate dielectrics in accordance with any of the embodiments of the present disclosure.

FIG. 12 is a side, cross-sectional view of an example IC package 2200 that may include one or more IC structures having at least one FET with a dual thickness gate dielectric in accordance with any of the embodiments disclosed herein. In some embodiments, the IC package 2200 may be a system-in-package (SiP).

As shown in FIG. 12, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 12 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 12 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 12 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 13.

The dies 2256 may take the form of any of the embodiments of the die 2002 discussed herein and may include any of the embodiments of an IC structure having at least one FET with a dual thickness gate dielectric, e.g., any of the IC structures/transistor arrangements shown in FIGS. 1-9, or any further embodiments of at least one FET with a dual thickness gate dielectric, described herein. In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be RF FE dies and/or logic dies, including at least one FET with a dual thickness gate dielectric as described herein, one or more of the dies 2256 may be memory dies (e.g., high bandwidth memory), etc. In some embodiments, any of the dies 2256 may include at least one FET with a dual thickness gate dielectric, e.g., as discussed above; in some embodiments, at least some of the dies 2256 may not include any FETs with a dual thickness gate dielectric.

The IC package 2200 illustrated in FIG. 12 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 12, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 13:
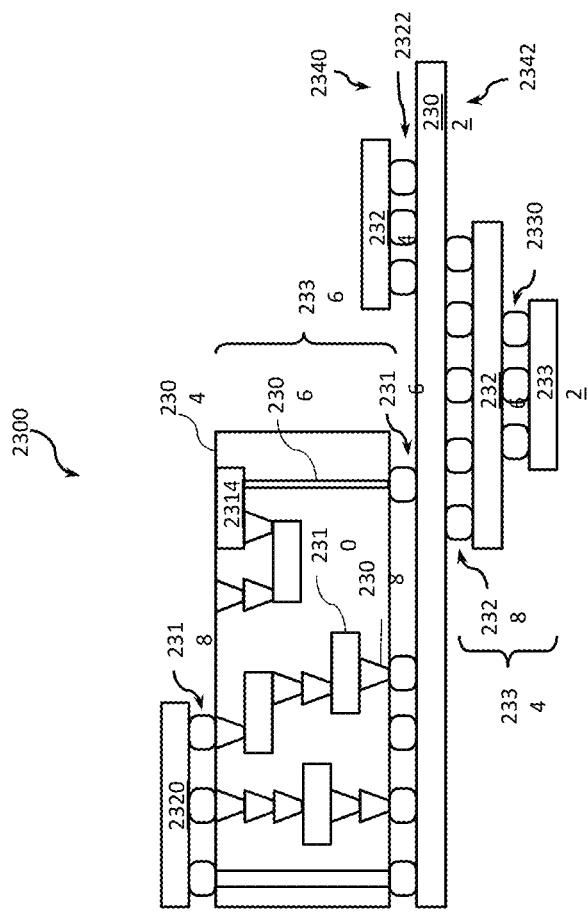
FIG. 13 is a cross-sectional side view of an IC device assembly that may include one or more FETs with dual thickness gate dielectrics in accordance with any of the embodiments of the present disclosure.

FIG. 13 is a cross-sectional side view of an IC device assembly 2300 that may include components having one or more IC structures implementing at least one FET with a dual thickness gate dielectric in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing at least one FET with a dual thickness gate dielectric in accordance with any of the embodiments disclosed herein; e.g., any of the IC packages discussed below with reference to the IC device assembly 2300 may take the form of any of the embodiments of the IC package 2200 discussed above with reference to FIG. 12 (e.g., may include at least one FET with a dual thickness gate dielectric in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 13 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 13), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 11B), an IC device (e.g., the IC structure, or transistor arrangements, of FIGS. 1-9), or any other suitable component. In particular, the IC package 2320 may include at least one FET with a dual thickness gate dielectric as described herein. Although a single IC package 2320 is shown in FIG. 13, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 13, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC structures implementing at least one FET with a dual thickness gate dielectric as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 13 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 14:
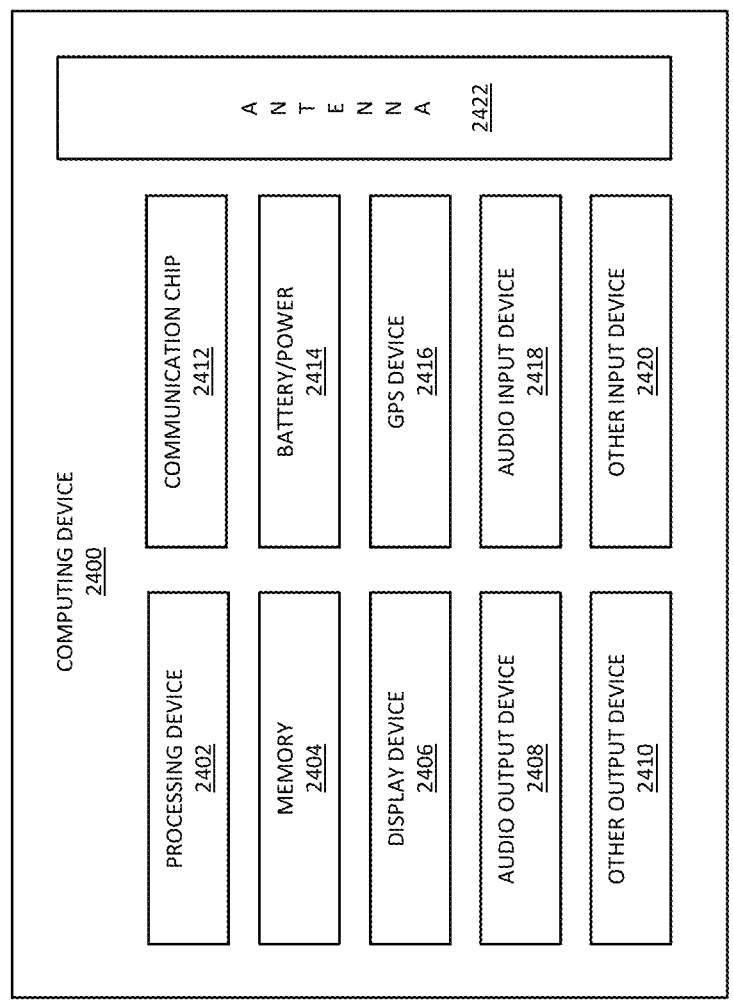
FIG. 14 is a block diagram of an example computing device that may include one or more FETs with dual thickness gate dielectrics in accordance with any of the embodiments of the present disclosure.

FIG. 14 is a block diagram of an example computing device 2400 that may include one or more components with one or more IC structures having at least one FET with a dual thickness gate dielectric in accordance with any of the embodiments disclosed herein. For example, any suitable ones of the components of the computing device 2400 may include a die (e.g., the die 2002 (FIG. 11B)) including at least one FET with a dual thickness gate dielectric in accordance with any of the embodiments disclosed herein. Any of the components of the computing device 2400 may include an IC device (e.g., any embodiment of the IC structures, or transistor arrangements, of FIGS. 1-9) and/or an IC package 2200 (FIG. 12). Any of the components of the computing device 2400 may include an IC device assembly 2300 (FIG. 13).

A number of components are illustrated in FIG. 14 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 14, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures with at least one FET with a dual thickness gate dielectric as described herein may be particularly advantageous for use within the one or more communication chips 2412, described above. For example, such IC structures with at least one FET with a dual thickness gate dielectric may be used to implement one or more of power amplifiers, low-noise amplifiers, filters (including arrays of filters and filter banks), switches, upconverters, downconverters, and duplexers, e.g., as a part of implementing an RF transmitter, an RF receiver, or an RF transceiver.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 15:
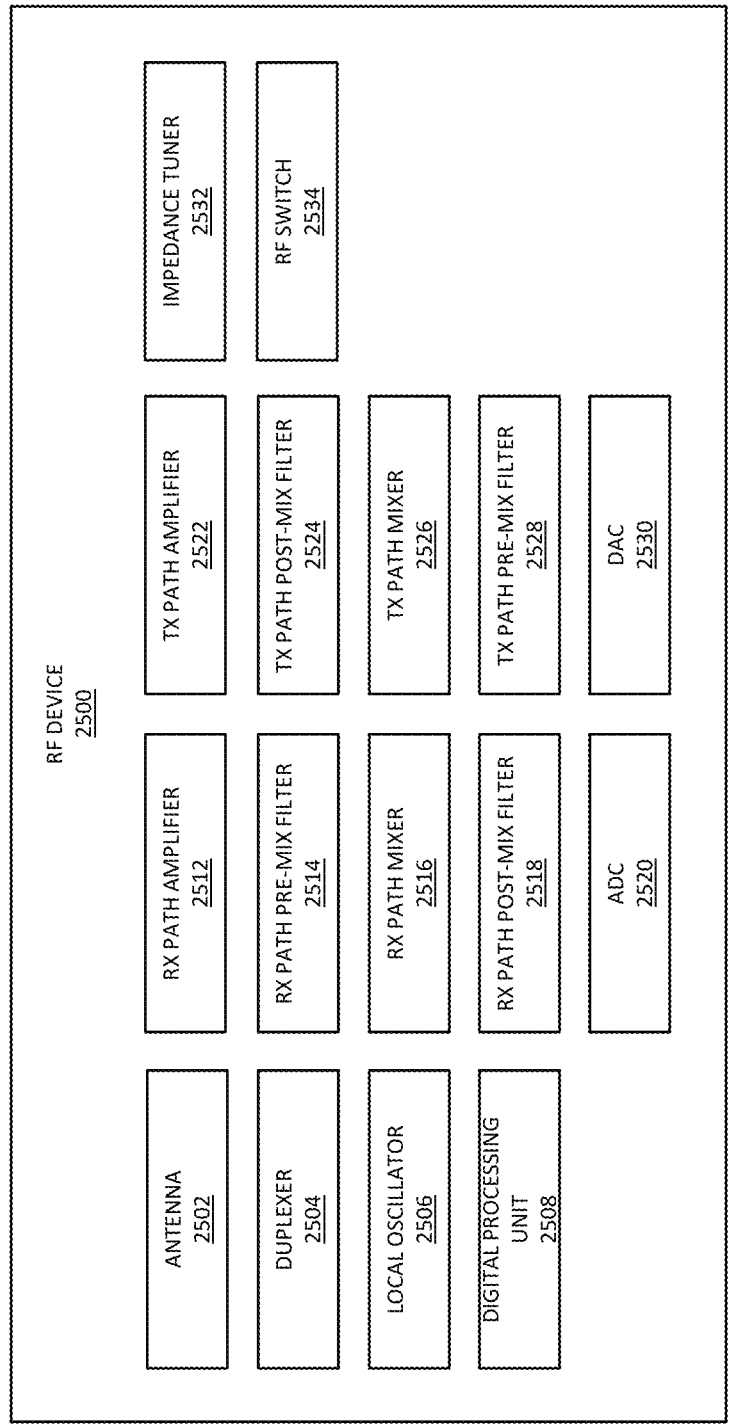
FIG. 15 is a block diagram of an example RF device that may include one or more FETs with dual thickness gate dielectrics in accordance with any of the embodiments of the present disclosure.

FIG. 15 is a block diagram of an example RF device 2500 that may include one or more components with one or more IC structures having at least one FET with a dual thickness gate dielectric in accordance with any of the embodiments disclosed herein. For example, any suitable ones of the components of the RF device 2500 may include a die (e.g., the die 2002 as described with reference to FIG. 11 or a die implementing any embodiment of the IC structures, or transistor arrangements, of FIGS. 1-9) including at least one FET with a dual thickness gate dielectric in accordance with any of the embodiments disclosed herein. Any of the components of the RF device 2500 may include an IC device (e.g., an IC device that includes any embodiment of the IC structures, or transistor arrangements, of FIGS. 1-9) and/or an IC package 2200 as described with reference to FIG. 12. Any of the components of the RF device 2500 may include an IC device assembly 2300 as described with reference to FIG. 13. In some embodiments, the RF device 2500 may be included within any components of the computing device 2400 as described with reference to FIG. 14, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 14, such as, but not limited to, the battery/power circuit 2414, the memory 2404, and various input and output devices as shown in FIG. 14.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using WiFi technology (e.g., a frequency band of 2.4 GHz, corresponding to a wavelength of about 12 cm, or a frequency band of 5.8 GHz, spectrum, corresponding to a wavelength of about 5 cm), e.g., in a WiFi-enabled device such as a desktop, a laptop, a video game console, a smart phone, a tablet, a smart TV, a digital audio player, a car, a printer, etc. In some implementations, a WiFi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in FDD or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 15 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 15, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 15, the RF device 2500 may include an antenna 2502, a duplexer 2504, a local oscillator 2506, a digital processing unit 2508. As also shown in FIG. 15, the RF device 2500 may include an RX path which may include an RX path amplifier 2512, an RX path pre-mix filter 2514, a RX path mixer 2516, an RX path post-mix filter 2518, and an analog-to-digital converter (ADC) 2520. As further shown in FIG. 15, the RF device 2500 may include a TX path which may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532 and an RF switch 2534. In various embodiments, the RF device 2500 may include multiple instances of any of the components shown in FIG. 15. The RX path amplifier 2512, the TX path amplifier 2522, the duplexer 2504, and the RF switch 2534 may be considered to form, or be a part of, an RF FE of the RF device 2500. The RX path mixer 2516 and the TX path mixer 2526 (possibly with their associated pre-mix and post-mix filters shown in FIG. 15) may be considered to form, or be a part of, an RF transceiver of the RF device 2500 (or of an RF receiver or an RF transmitter if only RX path or TX path components, respectively, are included in the RF device 2500).

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g. in bands having a separation of, e.g., 20 MHz from one another. If the RF device 2500 is a TDD transceiver, the antenna 2502 may be configured for sequential reception and transmission of communication signals in bands of frequencies which may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals which may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 14, descriptions of which are provided above (when used as the digital processing unit 2508, the processing device 2402 may, but does not have to, implement any of the IC structures and/or electronic devices as described herein, e.g., any of the IC structures and/or electronic devices having at least one FET with a dual thickness gate dielectric in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 15, in some embodiments, the RF device 2500 may further include a memory device, e.g., the memory device 2404 as described with reference to FIG. 14, configured to cooperate with the digital processing unit 2508. When used within, or coupled to, the RF device 2500, the memory device 2404 may, but does not have to, implement any of the IC structures as described herein, e.g., IC structures having at least one FET with a dual thickness gate dielectric in accordance with any of the embodiments disclosed herein.

Turning to the details of the RX path that may be included in the RF device 2500, the RX path amplifier 2512 may include an LNA. An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be, e.g., a harmonic or band-pass filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the downconverter 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 15, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset in phase from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a low-pass filter (or a pair of filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as aluminum nitride (AlN), enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators which may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g. antenna's impedance changes depending on, e.g., if the antenna is held in a hand, placed on a car roof, etc.

As described above, the RF switch 2534 may be used to selectively switch between a plurality of instances of any one of the components shown in FIG. 15, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, FETs with dual thickness gate dielectrics as described herein may be particularly advantageous when used in any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534.

The RF device 2500 provides a simplified version and, in further embodiments, other components not specifically shown in FIG. 15 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable PLL, configured to receive a reference clock signal and use it to generate a different clock signal which may then be used for timing the operation of the ADC 2520, the DAC 2530, and/or which may also be used by the local oscillator 2506 to generate the local oscillator signals to be used in the RX path or the TX path.

Select Examples

The following paragraphs provide various examples of the embodiments disclosed herein.

Example 1 provides a transistor arrangement that includes a semiconductor (channel) material provided over a portion of a support structure (e.g., a substrate, a die, or a chip); a source region and a drain region provided in the semiconductor material; and a gate stack provided over a portion of the semiconductor material that is between the source region and the drain region, where the portion includes a first portion and a second portion. The gate stack includes one or more gate electrode materials, a first gate dielectric provided between the first portion of the semiconductor material and the one or more gate electrode materials, and a second gate dielectric provided between the second portion of the semiconductor material and the one or more gate electrode materials, where a thickness of the first gate dielectric is different from a thickness of the second gate dielectric.

Example 2 provides the transistor arrangement according to example 1, where the first portion of the semiconductor material is closer to the source region than the second portion of the semiconductor material, and the second portion of the semiconductor material is closer to the drain region than the first portion of the semiconductor material.

Example 3 provides the transistor arrangement according to example 2, where a distance between the second portion of the semiconductor material and the drain region is between about 10 and 1000 nanometers.

Example 4 provides the transistor arrangement according to examples 2 or 3, where the thickness of the second gate dielectric (i.e., the gate dielectric that is closest to the drain region) is larger than the thickness of the first gate dielectric (i.e., the gate dielectric that is closest to the source region), e.g., the thickness of the second gate dielectric may be between about 1.1 and 5 times larger than the thickness of the first gate dielectric (e.g., about 2 times or about 3 times larger).

Example 5 provides the transistor arrangement according to example 4, where a dielectric constant of the second gate dielectric (i.e., the thicker gate dielectric) is at least 3 times smaller than a dielectric constant of the first gate dielectric (i.e., the thinner gate dielectric).

Example 6 provides the transistor arrangement according to any one of examples 1-5, where the first portion of the semiconductor material includes dopants of a first type (e.g., P-type dopants), and the second portion of the semiconductor material includes dopants of a second type (e.g., N-type dopants). In some such examples, a portion of the semiconductor material between the second portion and the drain region may also include dopants of the second type (e.g., N-type dopants).

Example 7 provides the transistor arrangement according to any one of examples 1-5, where each of the first portion and the second portion of the semiconductor material includes dopants of a first type (e.g., P-type dopants), and a portion of the semiconductor material that is between the second portion and the drain region includes dopants of a second type (e.g., N-type dopants).

Example 8 provides the transistor arrangement according to any one of examples 1-5, where the first portion of the semiconductor material portion includes dopants of a first type (e.g., P-type dopants), a portion of the second portion of the semiconductor material that is closest to the first portion includes dopants of the first type (e.g., P-type dopants), and a portion of the second portion of the semiconductor material that is between the portion of the second portion of the semiconductor material that is closest to the first portion and the drain region (e.g., the remaining portion of the second portion of the semiconductor material) includes dopants of a second type (e.g., N-type dopants).

Example 9 provides the transistor arrangement according to any one of examples 1-5, where a portion of the first portion of the semiconductor material that is closest to the source region includes dopants of a first type (e.g., P-type dopants), a portion of the first portion of the semiconductor material that is between the portion of the first portion of the semiconductor material that is closest to the source region and the second portion of the semiconductor material (i.e., the remaining portion of the first portion of the semiconductor material) includes dopants of a second type (e.g., N-type dopants), and the second portion of the semiconductor material includes dopants of the second type (e.g., N-type dopants). In some such examples, a portion of the semiconductor material between the second portion and the drain region may also include dopants of the second type (e.g., N-type dopants).

Example 10 provides the transistor arrangement according to any one of examples 6-9, where the dopants of the first type are at a dopant concentration between about $1\times10^{16}$ and about $1\times10^{18}$ dopant atoms per cubic centimeter, and/or the dopants of the second type are at a dopant concentration between about $1\times10^{16}$ and about $1\times10^{18}$ dopant atoms per cubic centimeter.

Example 11 provides the transistor arrangement according to any one of examples 6-10, where each of the source region and the drain region includes dopants of the second type, and dopant concentration of the dopants of the second type in each of the source region and the drain region is at least about $1\times10^{21}$ dopant atoms per cubic centimeter.

Example 12 provides the transistor arrangement according to any one of the preceding examples, where the one or more gate electrode materials over the first gate dielectric include a work function (WF) material and a gate electrode material so that the WF material is between the gate electrode material and the first gate dielectric, and the one or more gate electrode materials over the first gate dielectric include the gate electrode material in contact with the second gate dielectric. Thus, in some examples, a WF material may be provided over the first gate dielectric (e.g., the one closest to the source region) but not over the second gate dielectric. In other examples, either the same or different WF materials may be provided over both the first and second gate dielectrics.

Example 13 provides the transistor arrangement according to any one of the preceding examples, where each of the source region and the gate stack is electrically coupled to a ground potential, and the drain region is electrically coupled to each of an input/output port and a further circuit to be protected by the transistor arrangement.

Example 14 provides the transistor arrangement according to example 13, where the further circuit is a receiver circuit.

Example 15 provides an electronic device that includes an input/output (I/O) port; a receiver circuit, having an input coupled to the I/O port; and an electrostatic discharge protection (ESD) circuit, coupled to the I/O port and to the input of the receiver circuit, where the ESD circuit includes a transistor having a source region, a drain region, and a gate stack, each of the source region and the gate stack is coupled to a ground potential, the ESD circuit is coupled to the I/O port and to the input of the receiver circuit by having the drain region coupled to the I/O port and to the input of the receiver circuit, a first portion of the gate stack that includes a first gate dielectric, a second portion of the gate stack includes a second gate dielectric, a thickness of the first gate dielectric is smaller than a thickness of the second gate dielectric, and the first portion of the gate stack is closer to the source region than the second portion of the gate stack (and the second portion of the gate stack is closer to the drain region than the first portion of the gate stack).

Example 16 provides the electronic device according to example 15, further including a diode coupled between the ground potential and the I/O port.

Example 17 provides the electronic device according to example 16, where the electronic device further includes a silicon controlled rectifier (SCR) circuit, the drain region is coupled to the I/O port and to the input of the receiver circuit by being coupled to the SCR circuit and the SCR circuit being coupled to the I/O port and to the input of the receiver circuit.

Example 18 provides the electronic device according to any one of examples 15-17, where the transistor is an extended drain transistor.

In various further examples, the transistor of the electronic device according to any one of examples 15-18 may be implemented as the transistor arrangement according to any one of the preceding examples (e.g., the transistor arrangement according to any one of examples 1-14).

Example 19 provides a method of forming a transistor arrangement, the method including providing a source region and a drain region in a semiconductor (channel) material provided over a portion of a support structure (e.g., a substrate, a die, or a chip); and providing a gate stack over a portion of the semiconductor material that is between the source region and the drain region, where the portion includes a first portion and a second portion, and the gate stack includes one or more gate electrode materials, a first gate dielectric provided between the first portion of the semiconductor material and the one or more gate electrode materials, and a second gate dielectric provided between the second portion of the semiconductor material and the one or more gate electrode materials, where a thickness of the first gate dielectric is different from a thickness of the second gate dielectric.

Example 20 provides the method according to example 19, where the first portion of the semiconductor material is closer to the source region than the second portion of the semiconductor material, the second portion of the semiconductor material is closer to the drain region than the first portion of the semiconductor material, and the thickness of the second gate dielectric (i.e., the gate dielectric that is closest to the drain region) is larger than the thickness of the first gate dielectric.

Example 21 provides an IC package that includes an IC die, including one or more of transistor arrangements and/or electronic devices according to any one of the preceding examples (e.g., one or more of the transistor arrangements according to any one of examples 1-14 and/or one or more of the electronic devices according to any one of examples 15-18); and a further component, coupled to the IC die.

Example 22 provides the IC package according to example 21, where the further component is one of a package substrate, a flexible substrate, or an interposer.

Example 23 provides the IC package according to examples 21 or 22, where the further component is coupled to the IC die via one or more first level interconnects.

Example 24 provides the IC package according to example 23, where the one or more first level interconnects include one or more solder bumps, solder posts, or bond wires.

Example 25 provides a computing device that includes a circuit board; and an integrated circuit (IC) die coupled to the circuit board, where the IC die includes one or more of transistor arrangements and/or electronic devices according to any one of the preceding examples (e.g., one or more of the transistor arrangements according to any one of examples 1-14 and/or one or more of the electronic devices according to any one of examples 15-18), and/or is included in the IC package according to any one of the preceding examples (e.g., the IC package according to any one of examples 21-24).

Example 26 provides the computing device according to example 25, where the computing device is a wearable computing device (e.g., a smart watch) or handheld computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:
1. A transistor arrangement, comprising:
a semiconductor material;
a source region and a drain region in the semiconductor material; and
a gate stack over a portion of the semiconductor material that is between the source region and the drain region, wherein the portion includes a first portion and a second portion, and the gate stack includes:
one or more gate electrode materials,
a first gate dielectric between the first portion of the semiconductor material and the one or more gate electrode materials, and a second gate dielectric between the second portion of the semiconductor material and the one or more gate electrode materials, wherein a thickness of the first gate dielectric is different from a thickness of the second gate dielectric, and wherein a dielectric constant of the first gate dielectric is different from a dielectric constant of the second gate dielectric.

2. The transistor arrangement according to claim 1, wherein:

the first portion of the semiconductor material is closer to the source region than the second portion of the semiconductor material, and the second portion of the semiconductor material is closer to the drain region than the first portion of the semiconductor material.

3. The transistor arrangement according to claim 2, wherein a distance between the second portion of the semiconductor material and the drain region is between 10 and 1000 nanometers.

4. The transistor arrangement according to claim 2, wherein the thickness of the second gate dielectric is larger than the thickness of the first gate dielectric and wherein the dielectric constant of the second gate dielectric is smaller than the dielectric constant of the first gate dielectric.

5. The transistor arrangement according to claim 1, wherein the thickness of the second gate dielectric is larger than the thickness of the first gate dielectric and wherein the dielectric constant of the second gate dielectric is at least 3 times smaller than the dielectric constant of the first gate dielectric.

6. The transistor arrangement according to claim 1, wherein:

the first portion of the semiconductor material includes dopants of a first type at a dopant concentration between $1\times10^{16}$ and $1\times10^{18}$ dopant atoms per cubic centimeter, and the second portion of the semiconductor material includes dopants of a second type at a dopant concentration between $1\times10^{16}$ and $1\times10^{18}$ dopant atoms per cubic centimeter.

7. The transistor arrangement according to claim 1, wherein:

each of the first portion and the second portion of the semiconductor material includes dopants of a first type at a dopant concentration between $1\times10^{16}$ and $1\times10^{18}$ dopant atoms per cubic centimeter, and a portion of the semiconductor material that is between the second portion and the drain region includes dopants of a second type at a dopant concentration between $1\times10^{16}$ and $1\times10^{18}$ dopant atoms per cubic centimeter.

8. The transistor arrangement according to claim 1, wherein:

the first portion of the semiconductor material portion includes dopants of a first type at a dopant concentration between $1\times10^{16}$ and $1\times10^{18}$ dopant atoms per cubic centimeter, a portion of the second portion of the semiconductor material that is closest to the first portion includes dopants of the first type at a dopant concentration between $1\times10^{16}$ and $1\times10^{18}$ dopant atoms per cubic centimeter, and a portion of the second portion of the semiconductor material that is between the portion of the second portion of the semiconductor material that is closest to the first portion and the drain region includes dopants of a second type at a dopant concentration between $1\times10^{16}$ and $1\times10^{18}$ dopant atoms per cubic centimeter.

9. The transistor arrangement according to claim 1, wherein:

a portion of the first portion of the semiconductor material that is closest to the source region includes dopants of a first type at a dopant concentration between $1\times10^{16}$ and $1\times10^{18}$ dopant atoms per cubic centimeter, a portion of the first portion of the semiconductor material that is between the portion of the first portion of the semiconductor material that is closest to the source region and the second portion of the semiconductor material includes dopants of a second type at a dopant concentration between $1\times10^{16}$ and $1\times10^{18}$ dopant atoms per cubic centimeter, and the second portion of the semiconductor material includes dopants of the second type.

10. The transistor arrangement according to claim 9, wherein:

each of the source region and the drain region includes dopants of the second type, and dopant concentration of the dopants of the second type in each of the source region and the drain region is at least $1\times10^{21}$ dopant atoms per cubic centimeter.

11. The transistor arrangement according to claim 1, wherein:

the one or more gate electrode materials over the first gate dielectric include a work function (WF) material and a gate electrode material so that the WF material is between the gate electrode material and the first gate dielectric, and the one or more gate electrode materials over the first gate dielectric include the gate electrode material in contact with the second gate dielectric.

12. The transistor arrangement according to claim 1, wherein:

each of the source region and the gate stack is coupled to a ground potential, and the drain region is coupled to each of an input/output port and a further circuit.

13. The transistor arrangement according to claim 12, wherein the further circuit is a receiver circuit.

14. The transistor arrangement according to claim 1, wherein:

at least a portion of the first portion includes dopants of a first type at a dopant concentration between $1\times10^{16}$ and $1\times10^{18}$ dopant atoms per cubic centimeter, and at least a portion of the second portion or a portion of the semiconductor material that is between the second portion and the drain region includes dopants of a second type at a dopant concentration between $1\times10^{16}$ and $1\times10^{18}$ dopant atoms per cubic centimeter.

15. An electronic device, comprising:

an input/output (I/O) port;

a receiver circuit, having an input coupled to the I/O port;

an electrostatic discharge protection (ESD) circuit, coupled to the I/O port and to the input of the receiver circuit; and a diode, wherein:

the ESD circuit includes a transistor having a source region, a drain region, and a gate stack, each of the source region and the gate stack is coupled to a ground potential, the ESD circuit is coupled to the I/O port and to the input of the receiver circuit by having the drain region coupled to the I/O port and to the input of the receiver circuit, and the diode is coupled between the ground potential and the I/O port.

16. The electronic device according to claim 15, wherein:
the electronic device further includes a silicon controlled rectifier (SCR) circuit,
the drain region is coupled to the I/O port and to the input of the receiver circuit by being coupled to the SCR circuit and the SCR circuit being coupled to the I/O port and to the input of the receiver circuit.

17. The electronic device according to claim 15, wherein the transistor is an extended drain transistor.

18. The electronic device according to claim 15, wherein:
a first portion of the gate stack that includes a first gate dielectric,
a second portion of the gate stack includes a second gate dielectric,
a thickness of the first gate dielectric is smaller than a thickness of the second gate dielectric, and
the first portion of the gate stack is closer to the source region than the second portion of the gate stack.

19. A method of forming a transistor arrangement, the method comprising:
providing a source region and a drain region in a semiconductor material; and
providing a gate stack over a portion of the semiconductor material that is between the source region and the drain region, wherein the portion includes a first portion and a second portion, and the gate stack includes:
one or more gate electrode materials,
a first gate dielectric between the first portion of the semiconductor material and the one or more gate electrode materials, and
a second gate dielectric between the second portion of the semiconductor material and the one or more gate electrode materials,
wherein:
a thickness of the first gate dielectric is different from a thickness of the second gate dielectric,
at least a portion of the first portion includes dopants of a first type at a dopant concentration between $1\times10^{16}$ and $1\times10^{18}$ dopant atoms per cubic centimeter, and
at least a portion of the second portion or a portion of the semiconductor material that is between the second portion and the drain region includes dopants of a second type at a dopant concentration between $1\times10^{16}$ and $1\times10^{18}$ dopant atoms per cubic centimeter.

20. The method according to claim 19, wherein:
the first portion of the semiconductor material is closer to the source region than the second portion of the semiconductor material,
the second portion of the semiconductor material is closer to the drain region than the first portion of the semiconductor material, and
the thickness of the second gate dielectric is larger than the thickness of the first gate dielectric.

* * * * *